United States Patent
Schloss et al.

(10) Patent No.: US 11,348,795 B2
(45) Date of Patent: May 31, 2022

(54) METAL FILL PROCESS FOR THREE-DIMENSIONAL VERTICAL NAND WORDLINE

(71) Applicant: Lam Research Corporation, Fremont, CA (US)

(72) Inventors: Lawrence Schloss, Palo Alto, CA (US); Raashina Humayun, Los Altos, CA (US); Sanjay Gopinath, Fremont, CA (US); Juwen Gao, San Jose, CA (US); Michal Danek, Cupertino, CA (US); Kaihan Abidi Ashtiani, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 117 days.

(21) Appl. No.: 16/638,430

(22) PCT Filed: Aug. 10, 2018

(86) PCT No.: PCT/US2018/046232
§ 371 (c)(1),
(2) Date: Feb. 11, 2020

(87) PCT Pub. No.: WO2019/036292
PCT Pub. Date: Feb. 21, 2019

(65) Prior Publication Data
US 2020/0211853 A1 Jul. 2, 2020

Related U.S. Application Data

(60) Provisional application No. 62/545,405, filed on Aug. 14, 2017.

(51) Int. Cl.
*C23C 16/14* (2006.01)
*H01L 21/285* (2006.01)
(Continued)

(52) U.S. Cl.
CPC ........ *H01L 21/28568* (2013.01); *C23C 16/14* (2013.01); *C23C 16/16* (2013.01);
(Continued)

(58) Field of Classification Search
CPC ......... H01L 21/28568; H01L 21/76877; H01L 27/11556; H01L 27/11582;
(Continued)

(56) References Cited

U.S. PATENT DOCUMENTS

| | | |
|---|---|---|
| 4,746,375 A | 5/1988 | Iacovangelo |
| 4,804,560 A | 2/1989 | Shioya et al. |

(Continued)

FOREIGN PATENT DOCUMENTS

| | | |
|---|---|---|
| CN | 101154576 A | 4/2008 |
| CN | 101308794 A | 11/2008 |

(Continued)

OTHER PUBLICATIONS

Soo-Hyun Kim et al., Electrochemical and Solid-State Letters, The Electrochemical Society, 2005, p. C155-C159 (Year: 2005).*

(Continued)

*Primary Examiner* — Selim U Ahmed
*Assistant Examiner* — Evan G Clinton
(74) *Attorney, Agent, or Firm* — Weaver Austin Villenueve & Sampson LLP

(57) ABSTRACT

Disclosed are methods of depositing a transition metal such as tungsten on a semiconductor substrate. The method includes providing a gas mixture of diborane with a balance of hydrogen, where the hydrogen serves to stabilize the diborane in the gas mixture. The method further includes delivering the gas mixture to the semiconductor substrate to form a boron layer, where the boron layer serves as a reducing agent layer to convert a metal-containing precursor to metal, such as a tungsten-containing precursor to tung- (Continued)

sten. In some implementations, the semiconductor substrate includes a vertical structure, such as a three-dimensional vertical NAND structure, with horizontal features or wordlines having openings in sidewalls of the vertical structure, where the boron layer may be conformally deposited in the horizontal features of the vertical structure.

20 Claims, 10 Drawing Sheets

(51) Int. Cl.
*C23C 16/16* (2006.01)
*C23C 16/455* (2006.01)
*H01L 21/768* (2006.01)
*H01L 27/11556* (2017.01)
*H01L 27/11582* (2017.01)

(52) U.S. Cl.
CPC .. *C23C 16/45553* (2013.01); *H01L 21/76877* (2013.01); *H01L 27/11556* (2013.01); *H01L 27/11582* (2013.01)

(58) Field of Classification Search
CPC ......... H01L 21/76876; H01L 21/28562; H01L 21/28556; H01L 21/0262; H01L 27/11551; H01L 27/11524; H01L 27/11529; H01L 21/02129; C23C 16/14; C23C 16/16; C23C 16/45553; C23C 16/45523; C23C 16/06
See application file for complete search history.

(56) References Cited

U.S. PATENT DOCUMENTS

| | | | |
|---|---|---|---|
| 4,874,719 A | 10/1989 | Kurosawa | |
| 4,962,063 A | 10/1990 | Maydan et al. | |
| 5,028,565 A | 7/1991 | Chang et al. | |
| 5,227,329 A | 7/1993 | Kobayashi et al. | |
| 5,250,329 A | 10/1993 | Miracky et al. | |
| 5,250,467 A | 10/1993 | Somekh et al. | |
| 5,308,655 A | 5/1994 | Eichman et al. | |
| 5,326,723 A | 7/1994 | Petro et al. | |
| 5,370,739 A | 12/1994 | Foster et al. | |
| 5,391,394 A | 2/1995 | Hansen | |
| 5,567,583 A | 10/1996 | Wang et al. | |
| 5,633,200 A | 5/1997 | Hu | |
| 5,661,080 A | 8/1997 | Hwang et al. | |
| 5,726,096 A | 3/1998 | Jung | |
| 5,795,824 A | 8/1998 | Hancock | |
| 5,804,249 A | 9/1998 | Sukharev et al. | |
| 5,817,576 A | 10/1998 | Tseng et al. | |
| 5,833,817 A | 11/1998 | Tsai et al. | |
| 5,913,145 A | 6/1999 | Lu et al. | |
| 5,916,365 A | 6/1999 | Sherman | |
| 5,916,634 A | 6/1999 | Fleming et al. | |
| 5,926,720 A | 7/1999 | Zhao et al. | |
| 5,956,609 A | 9/1999 | Lee et al. | |
| 5,963,833 A | 10/1999 | Thakur | |
| 5,994,749 A | 11/1999 | Oda | |
| 6,001,729 A | 12/1999 | Shinriki et al. | |
| 6,017,818 A | 1/2000 | Lu | |
| 6,034,419 A | 3/2000 | Nicholls et al. | |
| 6,037,263 A | 3/2000 | Chang | |
| 6,066,366 A | 5/2000 | Berenbaum et al. | |
| 6,099,904 A | 8/2000 | Mak et al. | |
| 6,107,200 A | 8/2000 | Takagi et al. | |
| 6,143,082 A | 11/2000 | McInerney et al. | |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,260,266 B1 | 7/2001 | Tamaki | |
| 6,265,312 B1 | 7/2001 | Sidhwa et al. | |
| 6,277,744 B1 | 8/2001 | Yuan et al. | |
| 6,284,316 B1 | 9/2001 | Sandhu et al. | |
| 6,287,965 B1 | 9/2001 | Kang et al. | |
| 6,294,468 B1 | 9/2001 | Gould-Choquette et al. | |
| 6,297,152 B1 | 10/2001 | Itoh et al. | |
| 6,306,211 B1 | 10/2001 | Takahashi et al. | |
| 6,309,964 B1 | 10/2001 | Tsai et al. | |
| 6,309,966 B1 | 10/2001 | Govindarajan et al. | |
| 6,310,300 B1 | 10/2001 | Cooney, III et al. | |
| 6,340,629 B1 | 1/2002 | Yeo et al. | |
| 6,355,558 B1 | 3/2002 | Dixit et al. | |
| 6,404,054 B1 | 6/2002 | Oh et al. | |
| 6,429,126 B1 | 8/2002 | Herner et al. | |
| 6,465,347 B2 | 10/2002 | Ishizuka et al. | |
| 6,491,978 B1 | 12/2002 | Kalyanam | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,581,258 B2 | 6/2003 | Yoneda et al. | |
| 6,593,233 B1 | 7/2003 | Miyazaki et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,777,331 B2 | 8/2004 | Nguyen | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,903,016 B2 | 6/2005 | Cohen | |
| 6,905,543 B1 | 6/2005 | Fair et al. | |
| 6,908,848 B2 | 6/2005 | Koo | |
| 6,936,538 B2 | 8/2005 | Byun | |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 | 11/2006 | Lee et al. | |
| 7,157,798 B1 | 1/2007 | Fair et al. | |
| 7,211,144 B2 | 5/2007 | Lu et al. | |
| 7,220,671 B2 | 5/2007 | Simka et al. | |
| 7,235,486 B2 | 6/2007 | Kori et al. | |
| 7,262,125 B2 | 8/2007 | Wongsenakhum et al. | |
| 7,338,900 B2 | 3/2008 | Mizuno et al. | |
| 7,355,254 B2 | 4/2008 | Datta et al. | |
| 7,416,979 B2 | 8/2008 | Yoon et al. | |
| 7,419,904 B2 | 9/2008 | Kato | |
| 7,429,402 B2 | 9/2008 | Gandikota et al. | |
| 7,465,665 B2 | 12/2008 | Xi et al. | |
| 7,465,666 B2 | 12/2008 | Kori et al. | |
| 7,485,340 B2 | 2/2009 | Elers et al. | |
| 7,501,343 B2 | 3/2009 | Byun et al. | |
| 7,501,344 B2 | 3/2009 | Byun et al. | |
| 7,563,718 B2 | 7/2009 | Kim | |
| 7,589,017 B2 | 9/2009 | Chan et al. | |
| 7,595,263 B2 | 9/2009 | Chung et al. | |
| 7,605,083 B2 | 10/2009 | Lai et al. | |
| 7,611,990 B2 | 11/2009 | Yoon et al. | |
| 7,655,567 B1 * | 2/2010 | Gao | H01L 21/76876 438/685 |
| 7,674,715 B2 | 3/2010 | Kori et al. | |
| 7,675,119 B2 | 3/2010 | Taguwa | |
| 7,691,749 B2 | 4/2010 | Levy et al. | |
| 7,695,563 B2 | 4/2010 | Lu et al. | |
| 7,709,385 B2 | 5/2010 | Xi et al. | |
| 7,732,327 B2 | 6/2010 | Lee et al. | |
| 7,745,329 B2 | 6/2010 | Wang et al. | |
| 7,745,333 B2 | 6/2010 | Lai et al. | |
| 7,749,815 B2 | 7/2010 | Byun | |
| 7,754,604 B2 | 7/2010 | Wongsenakhum et al. | |
| 7,772,114 B2 | 8/2010 | Chan et al. | |
| 7,955,972 B2 | 6/2011 | Chan et al. | |
| 7,964,505 B2 | 6/2011 | Khandelwal et al. | |
| 7,977,243 B2 | 7/2011 | Sakamoto et al. | |
| 8,048,805 B2 | 11/2011 | Chan et al. | |
| 8,053,365 B2 | 11/2011 | Humayun et al. | |
| 8,058,170 B2 | 11/2011 | Chandrashekar et al. | |
| 8,062,977 B1 | 11/2011 | Ashtiani et al. | |
| 8,071,478 B2 | 12/2011 | Wu et al. | |

(56) References Cited

U.S. PATENT DOCUMENTS

| | | |
|---|---|---|
| 8,087,966 B2 | 1/2012 | Hebbinghaus et al. |
| 8,101,521 B1 | 1/2012 | Gao et al. |
| 8,110,877 B2 | 2/2012 | Mukherjee et al. |
| 8,119,527 B1 | 2/2012 | Chadrashekar et al. |
| 8,129,270 B1 | 3/2012 | Chandrashekar et al. |
| 8,207,062 B2 | 6/2012 | Gao et al. |
| 8,258,057 B2 | 9/2012 | Kuhn et al. |
| 8,329,576 B2 | 12/2012 | Chan et al. |
| 8,367,546 B2 | 2/2013 | Humayun et al. |
| 8,409,985 B2 | 4/2013 | Chan et al. |
| 8,409,987 B2 | 4/2013 | Chandrashekar et al. |
| 8,551,885 B2 | 10/2013 | Chen et al. |
| 8,623,733 B2 | 1/2014 | Chen et al. |
| 8,709,948 B2 | 4/2014 | Danek et al. |
| 8,853,080 B2 | 10/2014 | Guan et al. |
| 8,975,184 B2 | 3/2015 | Chen et al. |
| 8,993,055 B2 | 3/2015 | Rahtu et al. |
| 9,034,760 B2 | 5/2015 | Chen et al. |
| 9,076,843 B2 | 7/2015 | Lee et al. |
| 9,153,486 B2 | 10/2015 | Arghavani et al. |
| 9,159,571 B2 | 10/2015 | Humayun et al. |
| 9,236,297 B2 | 1/2016 | Chen et al. |
| 9,240,347 B2 | 1/2016 | Chandrashekar et al. |
| 9,583,385 B2 | 2/2017 | Lee et al. |
| 9,589,808 B2 | 3/2017 | Bamnolker et al. |
| 9,613,818 B2 | 4/2017 | Ba et al. |
| 9,653,353 B2 | 5/2017 | Chandrashekar et al. |
| 9,673,146 B2 | 6/2017 | Chen et al. |
| 9,754,824 B2 | 9/2017 | Schloss et al. |
| 9,969,622 B2 | 5/2018 | Lei et al. |
| 9,978,605 B2 | 5/2018 | Bamnolker et al. |
| 10,546,751 B2 | 1/2020 | Bamnolker et al. |
| 2001/0007797 A1 | 7/2001 | Jang et al. |
| 2001/0008808 A1 | 7/2001 | Gonzalez |
| 2001/0014533 A1 | 8/2001 | Sun |
| 2001/0015494 A1 | 8/2001 | Ahn |
| 2001/0044041 A1 | 11/2001 | Badding et al. |
| 2002/0037630 A1 | 3/2002 | Agarwal et al. |
| 2002/0048938 A1 | 4/2002 | Ishizuka et al. |
| 2002/0090796 A1 | 7/2002 | Desai et al. |
| 2002/0117399 A1 | 8/2002 | Chen et al. |
| 2002/0155722 A1 | 10/2002 | Satta et al. |
| 2002/0168840 A1 | 11/2002 | Hong et al. |
| 2002/0177316 A1 | 11/2002 | Miller et al. |
| 2002/0190379 A1 | 12/2002 | Jian et al. |
| 2003/0013300 A1 | 1/2003 | Byun |
| 2003/0059980 A1 | 3/2003 | Chen et al. |
| 2003/0082902 A1 | 5/2003 | Fukui et al. |
| 2003/0091870 A1 | 5/2003 | Bhowmik et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0129828 A1 | 7/2003 | Cohen |
| 2003/0190802 A1 | 10/2003 | Wang et al. |
| 2003/0209193 A1 | 11/2003 | Van Wijck |
| 2003/0224217 A1 | 12/2003 | Byun et al. |
| 2004/0014315 A1 | 1/2004 | Lai et al. |
| 2004/0044127 A1 | 3/2004 | Okubo et al. |
| 2004/0142557 A1 | 7/2004 | Levy et al. |
| 2004/0151845 A1 | 8/2004 | Nguyen et al. |
| 2004/0202786 A1 | 10/2004 | Wongsenakhum et al. |
| 2004/0206267 A1 | 10/2004 | Sambasivan et al. |
| 2004/0247788 A1 | 12/2004 | Fang et al. |
| 2005/0009325 A1 | 1/2005 | Chung et al. |
| 2005/0031786 A1 | 2/2005 | Lee et al. |
| 2005/0059236 A1 | 3/2005 | Nishida et al. |
| 2005/0136594 A1 | 6/2005 | Kim |
| 2005/0191803 A1 | 9/2005 | Matsuse et al. |
| 2005/0208763 A1 | 9/2005 | Byun |
| 2006/0003581 A1 | 1/2006 | Johnston et al. |
| 2006/0040052 A1 | 2/2006 | Fang et al. |
| 2006/0094238 A1 | 5/2006 | Levy et al. |
| 2006/0145190 A1 | 7/2006 | Salzman et al. |
| 2006/0211244 A1 | 9/2006 | Deshpande et al. |
| 2006/0284317 A1 | 12/2006 | Ito et al. |
| 2007/0087560 A1 | 4/2007 | Kwak et al. |
| 2007/0099420 A1 | 5/2007 | Dominguez et al. |
| 2007/0190780 A1 | 8/2007 | Chung et al. |
| 2007/0264105 A1 | 11/2007 | Pharand et al. |
| 2008/0017891 A1 | 1/2008 | Datta et al. |
| 2008/0045010 A1 | 2/2008 | Wongsenakhum et al. |
| 2008/0081127 A1 | 4/2008 | Thompson et al. |
| 2008/0081452 A1 | 4/2008 | Kim et al. |
| 2008/0081453 A1 | 4/2008 | Kim et al. |
| 2008/0124926 A1 | 5/2008 | Chan et al. |
| 2008/0254619 A1 | 10/2008 | Lin et al. |
| 2008/0254623 A1 | 10/2008 | Chan et al. |
| 2008/0268642 A1 | 10/2008 | Yanagita et al. |
| 2008/0280438 A1 | 11/2008 | Lai et al. |
| 2008/0283844 A1 | 11/2008 | Hoshi et al. |
| 2008/0317954 A1 | 12/2008 | Lu et al. |
| 2009/0004848 A1 | 1/2009 | Kim et al. |
| 2009/0045517 A1 | 2/2009 | Sugiura et al. |
| 2009/0050937 A1 | 2/2009 | Murata et al. |
| 2009/0053893 A1 | 2/2009 | Khandelwal et al. |
| 2009/0137117 A1 | 5/2009 | Park et al. |
| 2009/0142509 A1 | 6/2009 | Yamamoto |
| 2009/0149022 A1 | 6/2009 | Chan et al. |
| 2009/0156004 A1* | 6/2009 | Kori ............... H01L 21/28562 438/685 |
| 2009/0160030 A1 | 6/2009 | Tuttle |
| 2009/0163025 A1 | 6/2009 | Humayun et al. |
| 2009/0315154 A1 | 12/2009 | Kirby et al. |
| 2010/0007797 A1 | 1/2010 | Stojancic |
| 2010/0035427 A1 | 2/2010 | Chan et al. |
| 2010/0055904 A1 | 3/2010 | Chen et al. |
| 2010/0062149 A1 | 3/2010 | Ma et al. |
| 2010/0072623 A1 | 3/2010 | Prindle et al. |
| 2010/0130002 A1 | 5/2010 | Dao et al. |
| 2010/0130038 A1 | 5/2010 | Lin et al. |
| 2010/0144140 A1 | 6/2010 | Chandrashekar et al. |
| 2010/0155846 A1 | 6/2010 | Mukherjee et al. |
| 2010/0159694 A1 | 6/2010 | Chandrashekar et al. |
| 2010/0167527 A1 | 7/2010 | Wu et al. |
| 2010/0244141 A1 | 9/2010 | Beyer et al. |
| 2010/0244260 A1 | 9/2010 | Hinomura |
| 2010/0267230 A1 | 10/2010 | Chandrashekar et al. |
| 2010/0267235 A1 | 10/2010 | Chen et al. |
| 2010/0273327 A1 | 10/2010 | Chan et al. |
| 2010/0330800 A1 | 12/2010 | Ivanov et al. |
| 2011/0059608 A1 | 3/2011 | Gao et al. |
| 2011/0156154 A1 | 6/2011 | Hoentschel et al. |
| 2011/0221044 A1 | 9/2011 | Danek et al. |
| 2011/0223763 A1 | 9/2011 | Chan et al. |
| 2011/0233778 A1 | 9/2011 | Lee et al. |
| 2011/0236594 A1 | 9/2011 | Haverkamp et al. |
| 2011/0281438 A1 | 11/2011 | Lee et al. |
| 2012/0009785 A1 | 1/2012 | Chandrashekar et al. |
| 2012/0015518 A1 | 1/2012 | Chandrashekar et al. |
| 2012/0040530 A1 | 2/2012 | Humayun et al. |
| 2012/0077342 A1 | 3/2012 | Gao et al. |
| 2012/0164832 A1 | 6/2012 | Chandrashekar et al. |
| 2012/0199887 A1 | 8/2012 | Chan et al. |
| 2012/0225192 A1 | 9/2012 | Yudovsky et al. |
| 2012/0231626 A1 | 9/2012 | Lee et al. |
| 2012/0244699 A1 | 9/2012 | Khandelwal et al. |
| 2012/0294874 A1 | 11/2012 | Macary et al. |
| 2013/0043554 A1 | 2/2013 | Piper |
| 2013/0062677 A1 | 3/2013 | Li et al. |
| 2013/0109172 A1 | 5/2013 | Collins et al. |
| 2013/0168864 A1 | 7/2013 | Lee et al. |
| 2013/0285195 A1 | 10/2013 | Piper |
| 2013/0302980 A1* | 11/2013 | Chandrashekar ........................... H01L 21/76879 438/666 |
| 2014/0011358 A1 | 1/2014 | Chen et al. |
| 2014/0027664 A1 | 1/2014 | Lei et al. |
| 2014/0030889 A1 | 1/2014 | Chen et al. |
| 2014/0061784 A1 | 3/2014 | Kang |
| 2014/0061931 A1 | 3/2014 | Kang |
| 2014/0073135 A1 | 3/2014 | Guan et al. |
| 2014/0154883 A1 | 6/2014 | Humayun et al. |
| 2014/0162451 A1 | 6/2014 | Chen et al. |
| 2014/0308812 A1 | 10/2014 | Arghavani et al. |

(56) References Cited

U.S. PATENT DOCUMENTS

| | | |
|---|---|---|
| 2014/0319614 A1 | 10/2014 | Paul et al. |
| 2015/0037972 A1 | 2/2015 | Danek et al. |
| 2015/0056803 A1 | 2/2015 | Chandrashekar et al. |
| 2015/0179461 A1 | 6/2015 | Bamnolker et al. |
| 2015/0279732 A1 | 10/2015 | Lee et al. |
| 2016/0118345 A1 | 4/2016 | Chen et al. |
| 2016/0190008 A1 | 6/2016 | Chandrashekar et al. |
| 2016/0293467 A1 | 10/2016 | Caveney et al. |
| 2016/0336222 A1 | 11/2016 | Knapp et al. |
| 2016/0351401 A1 | 12/2016 | Ba et al. |
| 2016/0351402 A1 | 12/2016 | Suzuki et al. |
| 2016/0351444 A1 | 12/2016 | Schloss et al. |
| 2017/0117155 A1 | 4/2017 | Bamnolker et al. |
| 2017/0133231 A1 | 5/2017 | Bamnolker et al. |
| 2017/0207087 A1 | 7/2017 | Roy et al. |
| 2018/0240675 A1 | 8/2018 | Bamnolker et al. |
| 2021/0238736 A1 | 8/2021 | Butail et al. |
| 2021/0335617 A1 | 10/2021 | Deng et al. |

FOREIGN PATENT DOCUMENTS

| | | |
|---|---|---|
| CN | 101447427 A | 6/2009 |
| CN | 101770978 A | 7/2010 |
| CN | 101952945 A | 1/2011 |
| CN | 101952945 A | 1/2011 |
| CN | 103125013 A | 5/2013 |
| CN | 103125013 A | 5/2013 |
| EP | 0 437 110 | 7/1991 |
| EP | 0437110 A2 | 7/1991 |
| EP | 1 156 132 | 11/2001 |
| EP | 1156132 A2 | 11/2001 |
| EP | 1 179 838 | 2/2002 |
| EP | 1179838 A2 | 2/2002 |
| JP | S5629648 A | 3/1981 |
| JP | S5629648 A | 3/1981 |
| JP | H2-187031 A | 7/1990 |
| JP | H02187031 A | 7/1990 |
| JP | H4-142061 A | 5/1992 |
| JP | H04142061 A | 5/1992 |
| JP | H5-226280 A | 9/1993 |
| JP | H05226280 A | 9/1993 |
| JP | H7-147321 A | 6/1995 |
| JP | H07147321 A | 6/1995 |
| JP | H07-226393 | 8/1995 |
| JP | H07226393 A | 8/1995 |
| JP | 08-115984 | 5/1996 |
| JP | H08115984 A | 5/1996 |
| JP | 09-022896 A | 1/1997 |
| JP | 09-027596 | 1/1997 |
| JP | H0922896 A | 1/1997 |
| JP | H0927596 A | 1/1997 |
| JP | H10-144688 | 5/1998 |
| JP | H10144688 A | 5/1998 |
| JP | H10-163132 | 6/1998 |
| JP | H10163132 A | 6/1998 |
| JP | 2966406 B2 | 10/1999 |
| JP | 2966406 B2 | 10/1999 |
| JP | 11-330006 | 11/1999 |
| JP | H11330006 A | 11/1999 |
| JP | 2000-208516 | 7/2000 |
| JP | 2000208516 A | 7/2000 |
| JP | 2000-235962 | 8/2000 |
| JP | 2000235962 A | 8/2000 |
| JP | 2001-525889 | 12/2001 |
| JP | 2001525889 A | 12/2001 |
| JP | 2002-016066 A | 1/2002 |
| JP | 2002016066 A | 1/2002 |
| JP | 2002-124488 | 4/2002 |
| JP | 2002124488 A | 4/2002 |
| JP | 2003-193233 | 7/2003 |
| JP | 2003193233 A | 7/2003 |
| JP | 2004-235456 | 8/2004 |
| JP | 2004235456 A | 8/2004 |
| JP | 2004-273764 | 9/2004 |
| JP | 2004273764 A | 9/2004 |
| JP | 2004536960 A | 12/2004 |
| JP | 2005-029821 | 2/2005 |
| JP | 2005029821 A | 2/2005 |
| JP | 2005-518088 | 6/2005 |
| JP | 2005518088 A | 6/2005 |
| JP | 2007-009298 | 1/2007 |
| JP | 2007009298 A | 1/2007 |
| JP | 2007-027627 | 2/2007 |
| JP | 2007-027680 | 2/2007 |
| JP | 2007027627 A | 2/2007 |
| JP | 2007027680 A | 2/2007 |
| JP | 2007-507892 | 3/2007 |
| JP | 2007507892 A | 3/2007 |
| JP | 2007-520052 | 7/2007 |
| JP | 2007520052 A | 7/2007 |
| JP | 2007-250907 | 9/2007 |
| JP | 2007-251164 | 9/2007 |
| JP | 2007250907 A | 9/2007 |
| JP | 2007251164 A | 9/2007 |
| JP | 2008-016803 | 1/2008 |
| JP | 2008016803 A | 1/2008 |
| JP | 2008-060603 | 3/2008 |
| JP | 2008060603 A | 3/2008 |
| JP | 2008-091844 | 4/2008 |
| JP | 2008091844 A | 4/2008 |
| JP | 2008-283220 | 11/2008 |
| JP | 2008283220 A | 11/2008 |
| JP | 2008303466 A | 12/2008 |
| JP | 2009-024252 | 2/2009 |
| JP | 2009024252 A | 2/2009 |
| JP | 2009-144242 | 7/2009 |
| JP | 2009144242 A | 7/2009 |
| JP | 2009-533877 | 9/2009 |
| JP | 2009533877 A | 9/2009 |
| JP | 2009-540123 | 11/2009 |
| JP | 2009540123 A | 11/2009 |
| JP | 2010-251760 A | 11/2010 |
| JP | 2010251760 A | 11/2010 |
| JP | 2011-035366 | 2/2011 |
| JP | 2011035366 A | 2/2011 |
| JP | 2011192680 A | 9/2011 |
| JP | 2013080891 A | 5/2013 |
| JP | 2014049747 A | 3/2014 |
| JP | 2015067869 A | 4/2015 |
| KR | 100196018 B1 | 6/1999 |
| KR | 100272523 | 12/2000 |
| KR | 100272523 B1 | 12/2000 |
| KR | 20020040877 A | 5/2002 |
| KR | 10-2002-0049730 | 6/2002 |
| KR | 20020049730 A | 6/2002 |
| KR | 10-2005-0022261 | 3/2005 |
| KR | 20050022261 A | 3/2005 |
| KR | 20050054122 A | 6/2005 |
| KR | 10-2005-0087428 | 8/2005 |
| KR | 20050087428 A | 8/2005 |
| KR | 10-2006-0087844 | 8/2006 |
| KR | 20060087844 A | 8/2006 |
| KR | 10-2007-705936 | 4/2007 |
| KR | 100705936 B1 | 4/2007 |
| KR | 20080001460 A | 1/2008 |
| KR | 10-2008-0036679 | 4/2008 |
| KR | 20080036679 A | 4/2008 |
| KR | 20080060012 A | 7/2008 |
| KR | 20080061978 A | 7/2008 |
| KR | 10-2008-0101745 | 11/2008 |
| KR | 20080101745 A | 11/2008 |
| KR | 10-2008-0110897 | 12/2008 |
| KR | 20080110897 A | 12/2008 |
| KR | 20090068187 A | 6/2009 |
| KR | 20090074560 A | 7/2009 |
| KR | 10-2009-0095546 | 9/2009 |
| KR | 20090095546 A | 9/2009 |
| KR | 10-2009-0103815 | 10/2009 |
| KR | 20090103815 A | 10/2009 |
| KR | 20100014714 A | 2/2010 |
| KR | 20100029952 A | 3/2010 |
| KR | 20100114856 A | 10/2010 |
| KR | 20110027607 A | 3/2011 |
| KR | 10-2011-0056494 | 5/2011 |

(56) References Cited

FOREIGN PATENT DOCUMENTS

| | | |
|---|---|---|
| KR | 20110056494 A | 5/2011 |
| KR | 20110084166 A | 7/2011 |
| KR | 20110105645 A | 9/2011 |
| KR | 10-2011-0108382 | 10/2011 |
| KR | 20110108382 A | 10/2011 |
| KR | 20130119519 A | 10/2013 |
| TW | 310461 | 7/1997 |
| TW | 310461 B | 7/1997 |
| TW | 434708 B | 5/2001 |
| TW | 434708 B | 5/2001 |
| TW | 452607 B | 9/2001 |
| TW | 452607 B | 9/2001 |
| TW | 567544 B | 12/2003 |
| TW | 200710968 A | 3/2007 |
| TW | 201409697 A | 3/2014 |
| TW | 201519317 A | 5/2015 |
| WO | WO 98/51838 | 11/1998 |
| WO | WO-9851838 A1 | 11/1998 |
| WO | WO 01/27347 | 4/2001 |
| WO | WO 01/29893 | 4/2001 |
| WO | WO-0127347 A1 | 4/2001 |
| WO | WO-0129893 A1 | 4/2001 |
| WO | WO 02/41379 | 5/2002 |
| WO | WO-0241379 A1 | 5/2002 |
| WO | WO 03/029515 | 4/2003 |
| WO | WO-03029515 A2 | 4/2003 |
| WO | WO 2005/027211 | 3/2005 |
| WO | WO-2005027211 A1 | 3/2005 |
| WO | WO 2005/034223 | 4/2005 |
| WO | WO-2005034223 A1 | 4/2005 |
| WO | WO 2007/121249 | 10/2007 |
| WO | WO-2007121249 A2 | 10/2007 |
| WO | WO 2007/146537 | 12/2007 |
| WO | WO-2007146537 A2 | 12/2007 |
| WO | WO 2010/025357 | 3/2010 |
| WO | WO-2010025357 A2 | 3/2010 |
| WO | WO 2011/119293 | 9/2011 |
| WO | WO-2011119293 A2 | 9/2011 |
| WO | WO 2013/148880 | 10/2013 |
| WO | WO-2013148880 A1 | 10/2013 |
| WO | WO 2014/058536 | 4/2014 |
| WO | WO-2014058536 A1 | 4/2014 |
| WO | WO-2019036292 A1 | 2/2019 |

OTHER PUBLICATIONS

International Search Report and Written Opinion dated Dec. 4, 2018, in PCT Application No. PCT/US2018/046232.
U.S. Office Action dated Mar. 21, 2019, issued in U.S. Appl. No. 15/415,800.
U.S. Final Office Action, dated Jan. 14, 2016, issued in U.S. Appl. No. 13/949,092.
Chinese Third Office Action dated Oct. 8, 2018 issued in Application No. CN 20141085679.7.
Koren First Notification of Provisional Rejection, dated Dec. 8, 2010, issued in Application No. KR 2004-0036346.
Koren Office Action, dated Jun. 13, 2011, issued in Application No. KR 2011-0032098.
Koren Office Action, dated Nov. 24, 2010, issued in Application No. KR 10-2004-0013210.
Koren Office Action, dated Mar. 28, 2013, issued in Application No. KR 10-2007-0012027.
Koren Office Action dated Sep. 6, 2012 issued in Application No. KR 2011-7004322.
Koren Office Action dated Jul. 19, 2013 issued in Application No. KR 2011-7004322.
Koren Office Action dated Nov. 4, 2013 issued in Application No. KR 10-2013-7027117.
Koren Office Action dated Mar. 21, 2013 issued in Application No. KR 10-2010-0024905.
Koren Notification of Provisional Rejection dated Jul. 17, 2012, issued in Application No. KR 2010-0087997.
Koren Office Action dated Mar. 4, 2013 in Application No. KR 2010-0035449.
Koren Second Office Action dated Jan. 25, 2014 in Application No. KR 10-2010-0035453.
Koren First Office Action dated Jul. 10, 2015 issued in Application No. KR 10-2014-0090283.
Chinese Decision of Final Rejection dated Aug. 24, 2018 issued in Application No. CN 201380022693.8.
Koren First Office Action dated Apr. 18, 2019 issued in Application No. KR 10-2014-7030125.
Koren First Office Action dated Aug. 30, 2019 issued in Application No. KR 10-2013-0075854.
Koren First Office Action dated Sep. 24, 2019 issued in Application No. KR 10-2013-0089834.
Li et al. (2002) "Deposition of $WN_xC_y$ Thin Films by ALCVD™ Method for Diffusion Barriers in Metallization," *IITC Conference Report*, 3 pp.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], *Journal of Applied Physics*, 58(11):4191-4199.
U.S. Appl. No. 13/758,928, filed Feb. 4, 2013, Humayun et al.
Aldjapan.com "Principle-ALD Japan, Inc." [webpage] pp. 1-10. [retrieved from URL: https://aldjapan.com/%E5%8E%9F%E7%90%86/].
Becker, Jill (Apr. 7, 2003) "Diffusion barrier properties of tungsten nitride films grown by atomic layer deposition from bis(tert-butylimido)bis(dimethylamido)tungsten and ammonia," Applied Physics Letters, 82(14):2239-2241, [Retrieved online Dec. 13, 2013 at http://dx.doi.org/10.1063/1.1565699].
Bell et al. (Jan. 1996) "Batch Reactor Kinetic Studies of Tungsten LPCVD from Silane and Tungsten Hexafluoride", J. Electrochem. Soc., 143(1):296-302.
Chinese Fifth Office Action dated Aug. 24, 2018 issued in Application No. CN 201380022693.8 .
Chinese Fifth Office Action dated May 5, 2015 issued in Application No. CN 200980133560.1.
Chinese First Office Action dated Jun. 2, 2017 issued in Application No. CN 201410856793.7.
Chinese First Office Action dated Mar. 18, 2016 issued in Application No. CN 201380022693.8.
Chinese First Office Action dated Oct. 27, 2020 issued in Application No. CN 201811491805.5.
Chinese First Office Action dated Sep. 18, 2012 issued in Application No. CN 200980133560.1.
Chinese First Office Action dated Sep. 6, 2015 issued in Application No. CN 201310320848.8.
Chinese Fourth Office Action dated Jan. 5, 2015 issued in Application No. CN 200980133560.1.
Chinese Fourth Office Action dated Mar. 15, 2018 issued in Application No. CN 201380022693.8.
Chinese Second Office Action dated Aug. 7, 2013 issued in Application No. CN 200980133560.1.
Chinese Second Office Action dated Feb. 5, 2018 issued in Application No. CN 201410856793.7.
Chinese Second Office Action dated Jan. 23, 2017 issued in Application No. CN 201380022693.8.
Chinese Second Office Action dated May 16, 2016 issued in Application No. CN 201310320848.8.
Chinese Third Office Action dated Apr. 22, 2014 issued in Application No. CN 200980133560.1.
Chinese Third Office Action dated Oct. 8, 2018 issued in Application No. CN 201410856793.7.
Chinese Third Office Action dated Sep. 25, 2017 issued in Application No. CN 201380022693.8.
Collins et al. (Jan. 21, 2003) "Pulsed Deposition of Ultra Thin Tungsten for Plugfill of High Aspect Ratio Contacts," Presentation made at Semicon Korea, 9 pages.
Diawara, Y. et al. (1993) "Rapid thermal annealing for reducing stress in tungsten x-ray mask absorber," http://dx.doi.org/10.1116/1.586673, Journal of Vacuum Science & Technology B 11:296-300 (per table of contents of journal).

(56) References Cited

OTHER PUBLICATIONS

Elam et al. (2001) "Nucleation and Growth During Tungsten Atomic Layer Deposition on SiO2 Surfaces," Thin Solid Films, 13pp.
Fair, James A. (1983) Presentation by Inventor "Chemical Vapor Deposition of Refractory Metal Silicides," GENUS Incorporated, 27 pp.
George et al. (1996) "Surface Chemistry for atomic Layer Growth", J. Phys. Chem, 100(31):13121-13131.
Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf.], Materials Transactions, 43(7):1585-1592.
Habuka, Hitoshi (2010) "Advance of Atomic Layer Deposition in Semiconductor Materials Manufacturing Process: Cleaning Technology for Thin Film Formation Reactor" Department of Chemical and Energy Engineering, Yokohama National University, 79, 5 Tokiwadai Hodogaya-ku Kanagawa 240, 8501, Japan.
Hoover, Cynthia (Jul. 2007) "Enabling Materials for Contact Metallization," Praxair Electronic Materials R&D, pp. 1-16.
International Preliminary Report on Patentability dated Jun. 24, 2021 issued in Application No. PCT/US2019/066301.
International Preliminary Report on Patentability dated Nov. 19, 2020 in Application No. PCT/US2019/030712.
International Preliminary Report on Patentability dated Oct. 21, 2021, in application No. PCT/US2020/027107.
International Search Report and Written Opinion dated Apr. 13, 2020 issued in Application No. PCT/US2019/066301.
International Search Report and Written Opinion dated Aug. 19, 2019 in Application No. PCT/US2019/030712.
International Search Report and Written Opinion dated Jul. 24, 2020 issued in Application No. PCT/US2020/027107.
Japanese First Office Action dated Jun. 24, 2020 issued in Application No. JP 2016-105216.
Japanese First Office Action dated Jun. 3, 2020 issued in Application No. JP 2016-104837.
Japanese Notification of Reasons for Rejection dated Dec. 20, 2016 issued in Application No. JP 2015-503547.
Japanese Office Action dated Dec. 3, 2013 issued in Application No. JP 2011-525228.
Japanese Office Action dated Jul. 29, 2014 issued in Application No. JP 2010-093544.
Japanese Office Action dated Jun. 17, 2014 issued in Application No. JP 2010-055163.
Japanese Office Action dated Mar. 4, 2014 issued in Application No. JP 2010-093522.
Japanese Office Action dated May 7, 2013, issued in Application No. JP 2008-310322.
Japanese Office Action dated Sep. 3, 2013, issued in Application No. JP 2008-325333.
Japanese Second Office Action dated Apr. 5, 2021 issued in Application No. JP 2016-104837.
Japanese Second Office Action dated Mar. 3, 2021 issued in Application No. JP 2016-105216.
Klaus et al. (2000) "Atomic layer deposition of tungsten using sequential surface chemistry with a sacrificial stripping reaction," Thin Solid Films 360:145-153.
Klaus et al. (2000) "Atomically Controlled Growth of Tungsten and Tungsten Nitride Using Sequential Surface Reactions," Applied Surface Science, pp. 162-163, 479-491.
Korean Decision for Grant dated Apr. 7, 2020 issued in Application No. KR 10-2020-7000199.
Korean Decision for Grant dated Nov. 5, 2021 issued in Application No. KR 10-2014-0192527.
Korean Final Rejection dated Jun. 30, 2021 issued in Application No. KR 10-2014-0192527.
Korean Final Rejection Office Action dated Apr. 27, 2021 issued in Application No. KR 10-2016-0064157.
Korean First Notification of Provisional Rejection, dated Dec. 8, 2010, issued in Application No. KR 2004-0036346.
Korean First Office Action dated Apr. 18, 2019 issued in Application No. KR 10-2014-7030125.
Korean First Office Action dated Aug. 2, 2021, issued in Application No. KR 10-2014-0184759.
Korean First Office Action dated Aug. 30, 2019 issued in Application No. KR 10-2013-0075854.
Korean First Office Action dated Aug. 6, 2020 issued in Application No. KR 10-2014-0044410.
Korean First Office Action dated Dec. 21, 2020 issued in Application No. KR 10-2014-0192527.
Korean First Office Action dated Jan. 1, 2019 issued in Application No. KR 10-2013-0089130.
Korean First Office Action dated Jul. 10, 2015 issued in Application No. KR 10-2014-0090283.
Korean First Office Action dated Jul. 12, 2021 issued in Application No. KR 10-2021-0063953.
Korean First Office Action dated Nov. 25, 2020 issued in Application No. KR 10-2020-0124056.
Korean First Office Action dated Oct. 1, 2020 issued in Application No. KR 10-2016-0064157.
Korean First Office Action dated Sep. 24, 2019 issued in Application No. KR 10-2013-0089834.
Korean First Office Action [No Translation] dated Oct. 21, 2019 issued in Application No. KR 10-2013-0108151.
Korean Notification of Provisional Rejection dated Jul. 17, 2012, issued in Application No. KR 2010-0087997.
Korean Office Action dated Jul. 19, 2013 issued in Application No. KR 2011-7004322.
Korean Office Action dated Jul. 28, 2021 issued in Application No. KR 10-2016-0064157.
Korean Office Action, dated Jun. 13, 2011, issued in Application No. KR 2011-0032098.
Korean Office Action dated Jun. 17, 2014 issued in Application No. KR 10-2013-7027117.
Korean Office Action dated Jun. 22, 2021 issued in Application No. KR 10-2020-0124056.
Korean Office Action dated Jun. 28, 2020 issued in Application No. KR 10-2020-0141428.
Korean Office Action dated Mar. 21, 2013 issued in Application No. KR 10-2010-0024905.
Korean Office Action, dated Mar. 28, 2013, issued in Application No. KR 10-2007-0012027.
Korean Office Action dated Mar. 4, 2013 in Application No. KR 2010-0035449.
Korean Office Action, dated Nov. 24, 2010, issued in Application No. KR 10-2004-0013210.
Korean Office Action dated Nov. 30, 2020 issued in Application No. KR 10-2020-0141428.
Korean Office Action dated Nov. 4, 2013 issued in Application No. KR 10-2013-7027117.
Korean Office Action dated Sep. 6, 2012 issued in Application No. KR 2011-7004322.
Korean Second Office Action dated Apr. 7, 2020 issued in Application No. KR 10-2013-0075854.
Korean Second Office Action dated Jan. 25, 2014 in Application No. KR 10-2010-0035453.
Korean Second Office Action dated Mar. 12, 2020 issued in Application No. KR 10-2013-0108151.
Korean Third Office Action dated Jun. 26, 2020 issued in Application No. KR 10-2013-0108151.
Korean Third Office Action dated Jun. 29, 2020 issued in Application No. KR 10-2013-0075854.
KR Final Rejection dated Oct. 5, 2021, in application No. KR1020200141428 with English translation.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], Thin Solid Films, 370:114-121.
Lai, Ken K. and Lamb, H. Henry (1995) "Precursors for Organometallic Chemical Vapor Deposition of Tungsten Carbide Films," Chemistry Material, 7(12):2284-2292.

(56) References Cited

OTHER PUBLICATIONS

Lee et al. (Jan. 21, 2003) "Pulsed Deposition of Ultra Thin Tungsten and its Application for Plugfill of High Aspect Ratio Contacts," Abstract, 1 page.
Li et al. (2002) "Deposition of WNxCy—Thin Films by ALCVDTM Method for Diffusion Barriers in Metallization," IITC Conference Report, 3 pp.
Manik. P, et al. (2012) "Fermi-level unpinning and low resistivity in contacts to n-type Ge with a thin ZnO interfacial layer," App. Phys. Lett. 101:182105-5.
Notice of Allowance dated Dec. 3, 2012, issued in U.S. Appl. No. 13/095,734.
PCT International Preliminary Report on Patentability and Written Opinion, dated Mar. 10, 2011, issued in PCT/US2009/055349.
PCT International Preliminary Report on Patentability and Written Opinion, dated Oct. 9, 2014, issued in PCT/US2013/034167.
PCT International Search Report and Written Opinion, dated Apr. 12, 2010, issued in PCT/US2009/055349.
PCT International Search Report and Written Opinion, dated Jul. 26, 2013, issued in PCT/US2013/034167.
PCT Search Report and Written Opinion, dated Jan. 19, 2005, issued in PCT/US2004/006940.
Saito et al. (2001) "A Novel Copper Interconnection Technology Using Self Aligned Metal Capping Method," IEEE, 3pp.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], Journal of Applied Physics, 58(11):4194-4199.
Taiwan Examination Report dated Dec. 26, 2016 issued in Application No. TW102123248.
Taiwan Examination Report, dated Jun. 22, 2017, issued in Application No. TW 103113287.
Taiwan Examination Report dated Mar. 16, 2017 issued in Application No. TW 102132433.
Taiwan Examination Report dated Oct. 26, 2016 issued in Application No. TW 102126696.
Taiwan Examination Report dated Oct. 26, 2016 issued in Application No. TW 102126976.
Taiwan First Office Action dated Jun. 27, 2018 issued in Application No. TW 103145125.
Taiwan First Office Action [Reissued] dated Jun. 20, 2018, issued in Application No. TW 103144260.
Taiwan Office Action and Search Report dated Feb. 12, 2015 issued in Application No. TW 099130354.
Taiwan Office Action dated Aug. 4, 2015 issued in Application No. TW 099111859.
Taiwan Office Action dated Dec. 27, 2014 issued in Application No. TW 099111860.
Taiwan Office Action dated Jan. 10, 2017 issued in Application No. TW 105105984.
Taiwan Office Action dated Jun. 8, 2015 issued in Application No. TW 099107504.
Taiwan Office Action dated Oct. 25, 2016 issued in Application No. TW 102110947.
Taiwan Office Action (Rejection Decision) dated Oct. 28, 2015 issued in Application No. TW 099130354.
Taiwan Search Report dated Nov. 30, 2016 issued in Application No. TW 099130354.
Taiwanese First Office Action dated Nov. 13, 2019 issued in Application No. TW 105116371.
Taiwanese First Office Action dated Nov. 25, 2019 issued in Application No. TW 105116363.
Taiwanese Second Office Action dated Aug. 19, 2020 issued in Application No. TW 105116371.
Taiwanese Third Office Action dated Mar. 16, 2021 issued in Application No. TW 105116371.
U.S. Final Office Action, dated Apr. 14, 2017, issued in U.S. Appl. No. 14/965,806.
U.S. Final Office Action, dated Apr. 28, 2009, issued in U.S. Appl. No. 11/782,570.
U.S. Final Office Action, dated Apr. 30, 2012, issued in U.S. Appl. No. 12/755,248.
U.S. Final Office Action, dated Dec. 28, 2005, issued in U.S. Appl. No. 10/815,560.
U.S. Final Office Action, dated Dec. 30, 2010, issued in U.S. Appl. No. 11/963,698.
U.S. Final Office Action, dated Dec. 9, 2009, issued in U.S. Appl. No. 11/963,698.
U.S. Final Office Action, dated Feb. 14, 2014, issued in U.S. Appl. No. 13/560,688.
U.S. Final Office Action, dated Feb. 25, 2009, issued in U.S. Appl. No. 11/349,035.
U.S. Final Office Action, dated Feb. 26, 2009, issued in U.S. Appl. No. 11/265,531.
U.S. Final Office Action, dated Feb. 7, 2011, issued in U.S. Appl. No. 12/202,126.
U.S. Final Office Action, dated Jan. 13, 2010, issued in U.S. Appl. No. 12/030,645.
US Final Office Action, dated Jan. 14, 2016, issued in U.S. Appl. No. 13/949,092 [NOVLP491],.
U.S. Final Office Action, dated Jan. 20, 2017, issued in U.S. Appl. No. 14/723,275.
U.S. Final Office Action, dated Jan. 26, 2010 from U.S. Appl. No. 11/951,236.
U.S. Final Office Action, dated Jul. 14, 2005, issued in U.S. Appl. No. 10/649,351.
U.S. Final Office Action, dated Jul. 17, 2015, issued in U.S. Appl. No. 14/502,817.
U.S. Final Office Action, dated Jul. 2, 2014, issued in U.S. Appl. No. 13/020,748.
U.S. Final Office Action, dated Jul. 23, 2010, issued in U.S. Appl. No. 12/030,645.
U.S. Final Office Action, dated Jul. 25, 2016, issued in U.S. Appl. No. 14/738,685.
U.S. Final Office Action, dated Jun. 15, 2011, issued in U.S. Appl. No. 12/636,616.
U.S. Final Office Action, dated Jun. 2, 2015, issued in U.S. Appl. No. 14/097,160.
U.S. Final Office Action dated Mar. 21, 2019, issued in U.S. Appl. No. 15/415,800.
U.S. Final Office Action, dated May 17, 2006, issued in U.S. Appl. No. 10/984,126.
U.S. Final Office Action, dated May 18, 2017, issued in U.S. Appl. No. 13/949,092.
U.S. Final Office Action, dated May 31, 2016, issued in U.S. Appl. No. 14/135,375.
U.S. Final Office Action, dated May 7, 2010, issued in U.S. Appl. No. 12/202,126.
U.S. Final Office Action, dated Nov. 16, 2012, issued in U.S. Appl. No. 13/020,748.
U.S. Final Office Action, dated Nov. 17, 2011, issued in U.S. Appl. No. 12/829,119.
U.S. Final Office Action, dated Nov. 20, 2009, issued in U.S. Appl. No. 11/349,035.
U.S. Final Office Action, dated Nov. 26, 2013, issued in U.S. Appl. No. 13/633,798.
U.S. Final Office Action, dated Nov. 5, 2014, issued in U.S. Appl. No. 13/633,502.
U.S. Final Office Action, dated Oct. 16, 2014, issued in U.S. Appl. No. 13/862,048.
U.S. Final Office Action, dated Oct. 19, 2010, issued in U.S. Appl. No. 12/407,541.
U.S. Final Office Action, dated Sep. 12, 2012, issued in U.S. Appl. No. 12/755,259.
U.S. Final Office Action, dated Sep. 29, 2015, issued in U.S. Appl. No. 14/135,375.
U.S. Notice of Allowance and Fee Due, dated Jan. 24, 2011, issued in U.S. Appl. No. 12/030,645.
U.S. Notice of Allowance,, dated Apr. 24, 2007, issued in U.S. Appl. No. 10/815,560.
U.S. Notice of Allowance, dated Apr. 28, 2015, issued in U.S. Appl. No. 13/862,048.

(56) References Cited

OTHER PUBLICATIONS

U.S. Notice of Allowance, dated Apr. 6, 2010, issued in U.S. Appl. No. 11/951,236.
U.S. Notice of Allowance, dated Aug. 25, 2006, issued in U.S. Appl. No. 10/984,126.
U.S. Notice of Allowance, dated Aug. 3, 2016, issued in U.S. Appl. No. 13/851,885.
U.S. Notice of Allowance, dated Aug. 7, 2012, issued in U.S. Appl. No. 12/829,119.
U.S. Notice of Allowance, dated Dec. 14, 2016, issued in U.S. Appl. No. 13/851,885.
U.S. Notice of Allowance dated Dec. 24, 2013, issued in U.S. Appl. No. 12/723,532.
U.S. Notice of Allowance, dated Jan. 12, 2018, issued in U.S. Appl. No. 13/949,092.
U.S. Notice of Allowance, dated Jan. 19, 2005, issued in U.S. Appl. No. 10/435,010.
U.S. Notice of Allowance, dated Jan. 19, 2018, issued in U.S. Appl. No. 15/398,462.
U.S. Notice of Allowance, dated Jan. 20, 2017, issued in U.S. Appl. No. 14/989,444.
U.S. Notice of Allowance, dated Jan. 22, 2015, issued in U.S. Appl. No. 13/928,216.
U.S. Notice of Allowance, dated Jul. 10, 2013, issued in U.S. Appl. No. 12/755,259.
U.S. Notice of Allowance, dated Jul. 21, 2006, issued in U.S. Appl. No. 10/649,351.
U.S. Notice of Allowance, dated Jul. 25, 2011, issued in U.S. Appl. No. 12/363,330.
U.S. Notice of Allowance, dated Jun. 17, 2015, issued in U.S. Appl. No. 13/862,048.
U.S. Notice of Allowance, dated Jun. 2, 2015, issued in U.S. Appl. No. 14/173,733.
U.S. Notice of Allowance, dated Jun. 30, 2011, issued in U.S. Appl. No. 12/538,770.
U.S. Notice of Allowance, dated Jun. 7, 2013, issued in U.S. Appl. No. 12/202,126.
U.S. Notice of Allowance, dated Mar. 12, 2003, issued in U.S. Appl. No. 09/975,074.
U.S. Notice of Allowance, dated Mar. 2, 2010, issued in U.S. Appl. No. 11/349,035.
U.S. Notice of Allowance, dated Mar. 2, 2012, issued in U.S. Appl. No. 12/556,490.
U.S. Notice of Allowance, dated Mar. 2, 2015, issued in U.S. Appl. No. 13/633,502.
U.S. Notice of Allowance, dated Mar. 24, 2017, issued in U.S. Appl. No. 13/851,885.
U.S. Notice of Allowance, dated May 23, 2014, issued in U.S. Appl. No. 13/633,798.
U.S. Notice of Allowance, dated May 4, 2009, issued in U.S. Appl. No. 11/265,531.
U.S. Notice of Allowance, dated May 4, 2017, issued in U.S. Appl. No. 14/723,275.
U.S. Notice of Allowance, dated Nov. 17, 2009, issued in U.S. Appl. No. 11/305,368.
U.S. Notice of Allowance, dated Nov. 18, 2016, issued in U.S. Appl. No. 14/723,270.
U.S. Notice of Allowance dated Nov. 29, 2012, issued in U.S. Appl. No. 13/244,016.
U.S. Notice of Allowance, dated Nov. 4, 2014, issued in U.S. Appl. No. 13/560,688.
U.S. Notice of Allowance, dated Oct. 13, 2016, issued in U.S. Appl. No. 14/738,685.
U.S. Notice of Allowance, dated Oct. 25, 2016, issued in U.S. Appl. No. 14/135,375.
U.S. Notice of Allowance, dated Oct. 4, 2012, issued in U.S. Appl. No. 13/276,170.
U.S. Notice of Allowance, dated Oct. 7, 2004, issued in U.S. Appl. No. 10/435,010.
U.S. Notice of Allowance, dated Sep. 14, 2005, issued in U.S. Appl. No. 10/690,492.
U.S. Notice of Allowance, dated Sep. 17, 2009, issued in U.S. Appl. No. 11/782,570.
U.S. Notice of Allowance, dated Sep. 19, 2011, issued in U.S. Appl. No. 12/407,541.
U.S. Notice of Allowance, dated Sep. 2, 2011, issued in U.S. Appl. No. 11/963,698.
U.S. Notice of Allowance, dated Sep. 25, 2015, issued in U.S. Appl. No. 14/502,817.
U.S. Notice of Allowance, dated Sep. 30, 2011, issued in U.S. Appl. No. 12/636,616.
U.S. Notice of Allowance dated Sep. 4, 2013 issued in U.S. Appl. No. 12/755,259.
U.S. Notice of Allowance, dated Sep. 6, 2019, issued in U.S. Appl. No. 15/958,662.
U.S. Notice of Allowance, dated Sep. 9, 2015, issued in U.S. Appl. No. 14/097,160.
U.S. Notice of Allowance (Supplemental Notice of Allowability), dated Apr. 16, 2015, issued in U.S. Appl. No. 13/633,502.
U.S. Office Action, dated Apr. 16, 2012, issued in U.S. Appl. No. 13/276,170.
U.S. Office Action, dated Apr. 17, 2006, issued in U.S. Appl. No. 10/815,560.
U.S. Office Action, dated Apr. 19, 2012, issued in U.S. Appl. No. 12/829,119.
U.S. Office Action, dated Apr. 3, 2009, issued in U.S. Appl. No. 11/305,368.
U.S. Office Action, dated Apr. 4, 2019, issued in U.S. Appl. No. 15/958,662.
U.S. Office Action, dated Apr. 7, 2014, issued in U.S. Appl. No. 13/633,502.
U.S. Office Action, dated Aug. 21, 2008, issued in U.S. Appl. No. 11/265,531.
U.S. Office Action, dated Aug. 5, 2009, issued in U.S. Appl. No. 11/951,236.
U.S. Office Action, dated Aug. 6, 2012, issued in U.S. Appl. No. 13/095,734.
U.S. Office Action, dated Dec. 11, 2014, issued in U.S. Appl. No. 14/173,733.
U.S. Office Action dated Dec. 18, 2012, issued in U.S. Appl. No. 12/723,532.
U.S. Office Action, dated Dec. 18, 2014, issued in U.S. Appl. No. 14/097,160.
U.S. Office Action, dated Dec. 18, 2014, issued in U.S. Appl. No. 14/502,817.
U.S. Office Action, dated Dec. 23, 2014, issued in U.S. Appl. No. 13/851,885.
U.S. Office Action, dated Dec. 30, 2005, issued in U.S. Appl. No. 10/649,351.
U.S. Office Action, dated Feb. 1, 2016, issued in U.S. Appl. No. 14/723,275.
U.S. Office Action, dated Feb. 15, 2013, issued in U.S. Appl. No. 12/755,248.
U.S. Office Action, dated Feb. 16, 2012, issued in U.S. Appl. No. 12/755,259.
U.S. Office Action, dated Feb. 24, 2014, issued in U.S. Appl. No. 13/020,748.
U.S. Office Action, dated Feb. 8, 2005, issued in U.S. Appl. No. 10/649,351.
U.S. Office Action, dated Jan. 12, 2016, issued in U.S. Appl. No. 14/738,685.
U.S. Office Action, dated Jan. 21, 2016, issued in U.S. Appl. No. 14/135,375.
U.S. Office Action, dated Jan. 25, 2011, issued in U.S. Appl. No. 12/636,616.
U.S. Office Action, dated Jan. 7, 2013, issued in U.S. Appl. No. 12/202,126.
U.S. Office Action, dated Jul. 12, 2005, issued in U.S. Appl. No. 10/815,560.
U.S. Office Action, dated Jul. 12, 2016, issued in U.S. Appl. No. 14/723,270.

(56) References Cited

OTHER PUBLICATIONS

U.S. Office Action, dated Jul. 17, 2002, issued in U.S. Appl. No. 09/975,074.
U.S. Office Action dated Jul. 18, 2013, issued in U.S. Appl. No. 12/723,532.
U.S. Office Action, dated Jul. 20, 2017, issued in U.S. Appl. No. 15/398,462.
U.S. Office Action, dated Jul. 26, 2010 issued in U.S. Appl. No. 12/202,126.
U.S. Office Action, dated Jul. 28, 2016, issued in U.S. Appl. No. 14/723,275.
U.S. Office Action, dated Jul. 7, 2016, issued in U.S. Appl. No. 14/989,444.
U.S. Office Action, dated Jun. 11, 2009, issued in U.S. Appl. No. 11/963,698.
U.S. Office Action, dated Jun. 11, 2010, issued in U.S. Appl. No. 11/963,698.
U.S. Office Action, dated Jun. 14, 2011, issued in U.S. Appl. No. 12/556,490.
U.S. Office Action, dated Jun. 14, 2013, issued in U.S. Appl. No. 13/633,798.
U.S. Office Action, dated Jun. 20, 2013, issued in U.S. Appl. No. 13/560,688.
U.S. Office Action, dated Jun. 22, 2004, issued in U.S. Appl. No. 10/435,010.
U.S. Office Action, dated Jun. 24, 2009, issued in U.S. Appl. No. 12/030,645.
U.S. Office Action, dated Jun. 27, 2008, issued in U.S. Appl. No. 11/305,368.
U.S. Office Action, dated Jun. 30, 2011, issued in U.S. Appl. No. 12/829,119.
U.S. Office Action, dated Jun. 4, 2009, issued in U.S. Appl. No. 11/349,035.
U.S. Office Action, dated Mar. 23, 2005, issued in U.S. Appl. No. 10/690,492.
U.S. Office Action, dated Mar. 6, 2012, issued in U.S. Appl. No. 13/244,016.
U.S. Office Action, dated May 10, 2012, issued in U.S. Appl. No. 13/020,748.
U.S. Office Action, dated May 13, 2011, issued in U.S. Appl. No. 12/755,248.
U.S. Office Action, dated May 2, 2011, issued in U.S. Appl. No. 12/407,541.
US Office Action, dated May 29, 2015, issued in U.S. Appl. No. 13/949,092.
U.S. Office Action, dated May 3, 2010, issued in U.S. Appl. No. 12/407,541.
U.S. Office Action, dated May 30, 2014, issued in U.S. Appl. No. 13/862,048.
U.S. Office Action, dated May 6, 2015, issued in U.S. Appl. No. 14/135,375.
U.S. Office Action, dated Nov. 23, 2005, issued in U.S. Appl. No. 10/984,126.
U.S. Office Action, dated Nov. 23, 2010, issued in U.S. Appl. No. 12/538,770.
U.S. Office Action, dated Oct. 16, 2008, issued in U.S. Appl. No. 11/349,035.
U.S. Office Action dated Oct. 21, 2009, issued in U.S. Appl. No. 12/202,126.
U.S. Office Action, dated Oct. 24, 2018, issued in U.S. Appl. No. 15/415,800.
U.S. Office Action, dated Oct. 28, 2011, issued in U.S. Appl. No. 12/755,248.
U.S. Office Action, dated Sep. 11, 2017, issued in U.S. Appl. No. 14/965,806.
U.S. Office Action, dated Sep. 18, 2014, issued in U.S. Appl. No. 13/928,216.
U.S. Office Action, dated Sep. 19, 2016, issued in U.S. Appl. No. 13/949,092.
U.S. Office Action, dated Sep. 2, 2016, issued in U.S. Appl. No. 14/965,806.
U.S. Office Action, dated Sep. 28, 2006, issued in U.S. Appl. No. 10/815,560.
U.S. Office Action, dated Sep. 29, 2008, issued in U.S. Appl. No. 11/782,570.
U.S. Office Action Restriction/Election dated Sep. 9, 2021 issued in U.S. Appl. No. 17/250,014.
U.S. Appl. No. 13/758,928, Inventors Humayun et al., filed Feb. 4, 2013.
U.S. Appl. No. 17/601,918, Inventors Bowes et al., filed Oct. 6, 2021.
Wikipedia "Atomic layer deposition" [webpage] Mar. 25, 2020, pp. 1-9. retrieved from, URL: https://ja.wikipedia.org/w/index.php?title= Atomic Layer Deposition & oldid = 76757564.

* cited by examiner

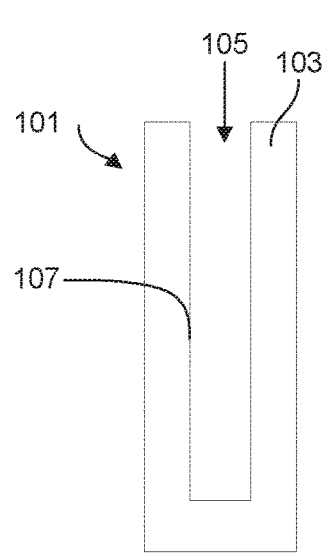
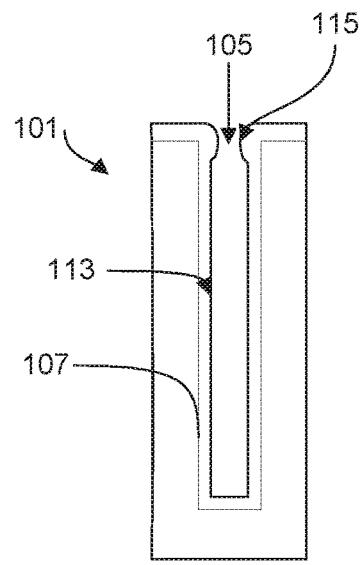
FIG. 1A     FIG. 1B
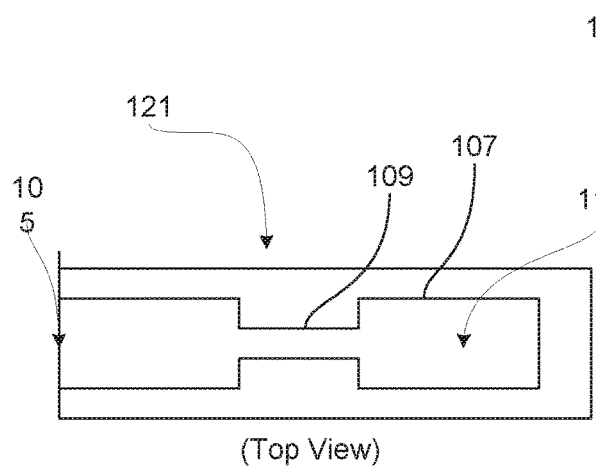
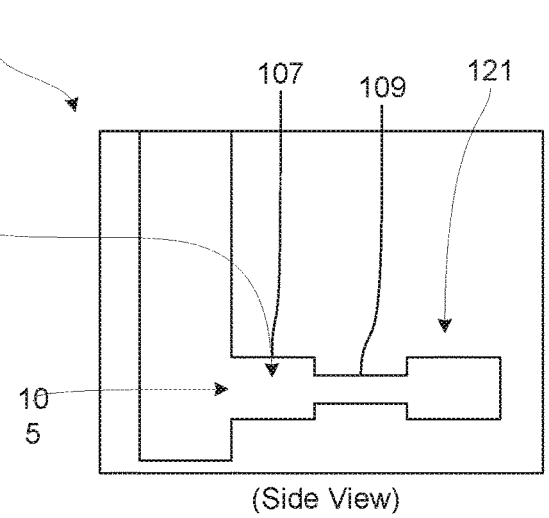
FIG. 1C     FIG. 1D

METAL FILL PROCESS FOR THREE-DIMENSIONAL VERTICAL NAND WORDLINE

CROSS-REFERENCE TO RELATED APPLICATION

This application claims the benefit of priority to U.S. Provisional Patent Application No. 62/545,405, filed Aug. 14, 2017, and titled "METAL FILL PROCESS FOR THREE-DIMENSIONAL VERTICAL NAND WORDLINE," which is hereby incorporated by reference herein in its entirety and for all purposes.

TECHNICAL FIELD

This disclosure relates generally to deposition of a transition metal on a semiconductor substrate and, more particularly to deposition of a transition metal on a semiconductor substrate by conversion of a boron layer that is formed by a boron-containing precursor.

BACKGROUND

Deposition of tungsten and tungsten-containing materials is an integral part of many semiconductor fabrication processes. Such deposition may be accomplished via chemical vapor deposition (CVD) techniques, plasma-enhanced CVD (PECVD) techniques, atomic layer deposition (ALD) techniques, as well as other deposition techniques known in the IC fabrication arts such as, for example, physical vapor deposition (PVD). Tungsten and tungsten-containing materials, hereinafter referred to as tungsten-based materials or just tungsten materials, may be used for horizontal interconnects, vias between adjacent metal layers, contacts between first metal layers and devices on the silicon substrate, and may generally be used within various high aspect ratio features utilized in IC design.

In a conventional process for depositing tungsten material, a substrate is heated to a predetermined process temperature in a deposition chamber, and a thin layer of tungsten material is deposited to serve as a seed or nucleation layer. Thereafter, a bulk layer of tungsten material is deposited atop the nucleation layer. Conventionally, the tungsten material is formed by the reduction of tungsten hexafluoride ($WF_6$) with hydrogen ($H_2$). Typically, tungsten material is deposited over an entire exposed surface area of the substrate which often includes one or more field regions, as well as various IC features. These features may have widely varying aspect ratios, and in some embodiments, one or more or all features may have relatively high aspect ratios.

SUMMARY

This disclosure pertains to a method. The method includes providing a gas mixture in a gas supply line, where the gas mixture includes diborane ($B_2H_6$) with a balance of hydrogen ($H_2$). The method further includes introducing the gas mixture from the gas supply line into a deposition chamber to a surface of a semiconductor substrate, where the semiconductor substrate includes a vertical structure having a plurality of horizontally-oriented features, where the diborane decomposes to form a boron layer in the horizontally-oriented features. The method further includes converting the boron layer to a transition metal layer in the semiconductor substrate.

In some implementations, the gas mixture includes at least 20% by volume of diborane with the balance of hydrogen. In some implementations, the gas mixture includes between about 20% and about 50% by volume of diborane with a balance of hydrogen. In some implementations, the transition metal includes molybdenum, ruthenium, cobalt, or tungsten. In some implementations, converting the boron layer to the transition metal layer includes reacting the boron layer with a tungsten-containing precursor to form a tungsten layer. In some implementations, the semiconductor substrate has openings in sidewalls of the vertical structure that are fluidically accessible from the vertical structure through the openings. In some implementations, the vertical structure is a three-dimensional (3-D) vertical NAND structure. In some implementations, the boron layer is conformally deposited in the horizontally-oriented features of the vertical structure, the boron layer having a step coverage of at least 90%.

This disclosure also pertains to an apparatus. The apparatus includes a gas supply line and a deposition chamber coupled to the gas supply line, where the deposition chamber is configured to process a semiconductor substrate in the deposition chamber, and where the gas supply line is configured to contain a gas mixture of diborane with a balance of hydrogen. The semiconductor substrate includes a vertical structure having a plurality of horizontally-oriented features. The apparatus further includes a controller configured to provide instructions for performing the following operations: introducing the gas mixture from the gas supply line into the deposition chamber to the surface of the semiconductor substrate, where the diborane decomposes to form a boron layer in the horizontally-oriented features, and converting the boron layer to a transition metal layer in the semiconductor substrate.

In some implementations, the gas mixture includes at least 20% by volume of diborane with the balance of hydrogen. In some implementations, the gas mixture includes between about 20% and about 50% by volume of diborane with the balance of hydrogen. In some implementations, the transition metal layer includes molybdenum, ruthenium, cobalt, or tungsten. In some implementations, the system controller configured with instructions for converting the boron layer is configured with instructions for reacting the boron layer with a transition metal precursor to form the transition metal layer. In some implementations, the semiconductor substrate has openings in sidewalls of the vertical structure that are fluidically accessible from the vertical structure through the openings. In some implementations, the controller is further configured with instructions for performing the following operation: exposing the semiconductor substrate to a reducing gas, wherein the reducing gas includes silane, disilane, or hydrogen. In some implementations, the controller is further configured with instructions for performing the following operation: providing the semiconductor substrate in the deposition chamber.

These and other embodiments are described further below with reference to the figures.

BRIEF DESCRIPTION OF THE DRAWINGS

FIG. 1A shows the cross-section of a vertical feature in a substrate which may be designed to be filled with tungsten material.

FIG. 1B shows an example of a similar feature to FIG. 1A, but having a re-entrant profile, due to the presence of an under-layer lining the bottom, sidewalls, and opening of the feature.

FIG. 1C illustrates a top-down plan view of a horizontal feature exhibiting a constriction roughly in the middle of its sidewall. In some embodiments, such horizontal features may be what are referred to as "wordlines" in a vertically integrated memory structure.

FIG. 1D illustrates a side-view of the same horizontal feature shown in FIG. 1C, but here shown having an opening to a vertical structure, and thus forming a part of vertical structure.

DETAILED DESCRIPTION

Figure 2A:
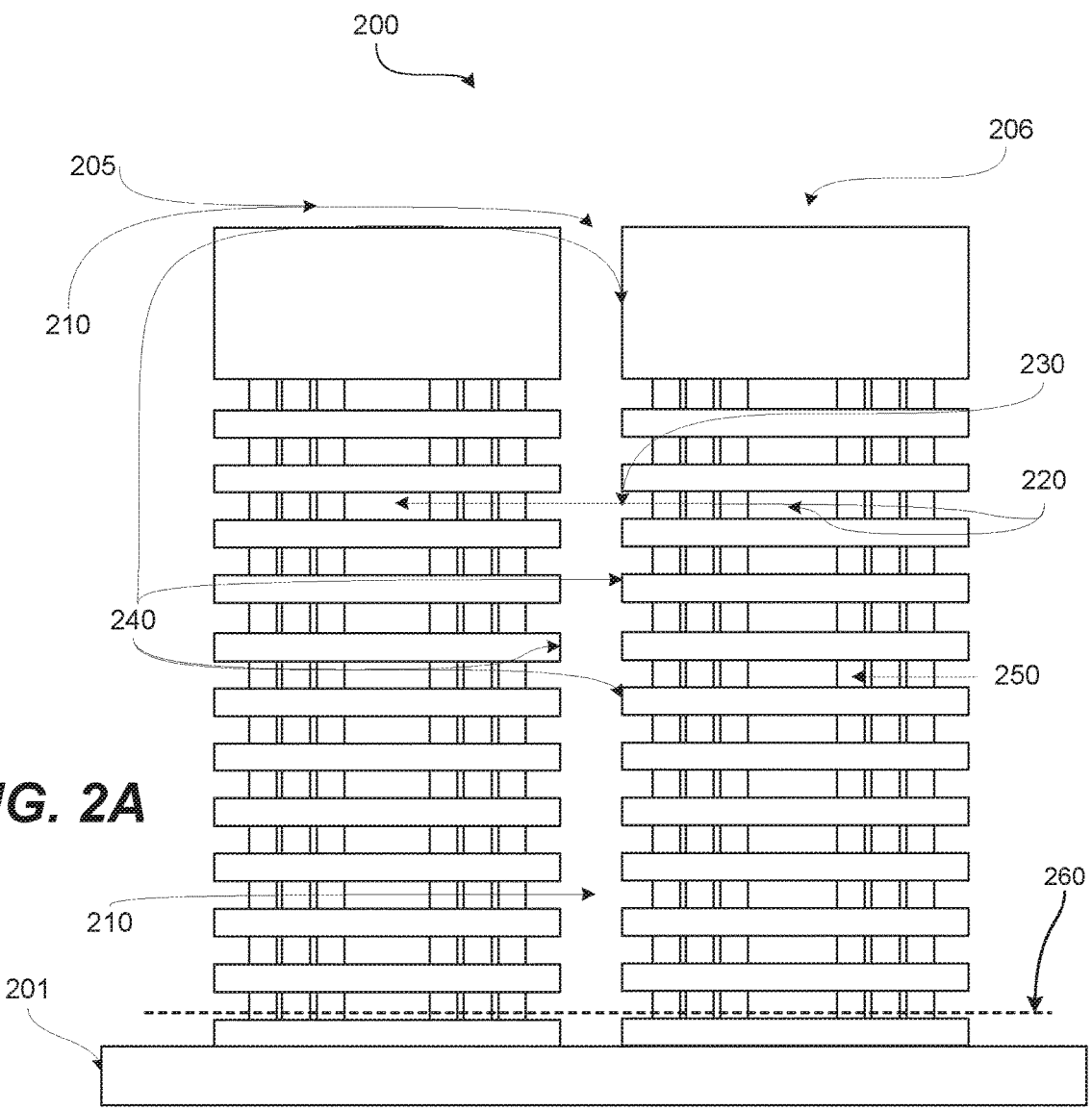
FIG. 2A presents a cross-sectional side-view of a 3D vertical memory NAND (VNAND) structure (formed on a semiconductor substrate) having VNAND stacks (left and right), a central vertical structure, and a plurality of stacked horizontal features with openings on opposite sidewalls of central vertical structure.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with specific embodiments, it will be understood that these embodiments are not intended to be limiting.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Three-Dimensional Vertical NAND Structures

Despite frequent employment of tungsten materials in integrated circuit (IC) design and fabrication, there are nevertheless difficulties associated with its use. For instance, depositing tungsten material into small features or features having a high aspect ratio may cause the formation of voids within the deposited tungsten. A void is simply a region within a structure or feature which is left unfilled after surrounding regions have been filled. Oftentimes, void formation is caused by a disproportionate accumulation of deposited material near a feature's entrance, resulting in the entrance becoming blocked and pinching off the interior volume of the feature preventing further deposition within the interior volume. Once blocked or pinched off, reactive deposition precursor species have no entry path into the interior volume precluding any further deposition within these regions from occurring. In other cases, even without pinch-off, a seam may be exhibited in the deposited tungsten material due to the fact that tungsten material tends to be deposited from the sidewalls out (rather than exhibiting bottom-up fill). Thus, such a seam is typically elongated along a fair portion of a feature's central axis and extends towards the bottom of the feature. Sometimes, the presence of a seam may lead to void formation, such as when a seam extends close to the field region after completion of the filling process and subsequent chemical-mechanical planarization opens the seam. In any event, seams and voids may cause high resistance, substrate contamination, loss of material, and otherwise adversely affect the electrical properties of integrated circuits.

Aspects of the present disclosure may achieve uniform tungsten fill of semiconductor substrate structures and features while minimizing or eliminating the formation of voids and seems. Applications of such uniform tungsten fill include logic and memory contact fill, DRAM buried wordline fill, vertically integrated memory gate/wordline fill, and 3D integration (TSV). The methods, apparatuses, and systems described herein may be used to fill vertical features—a via, for instance—as well as horizontal features, such as the horizontal wordlines within a vertical NAND (VNAND) structure—to be described in more detail below. The substrates having structures or features to be filled may be 200, 300, or 450 mm semiconductor wafers, or wafers having diameters between about 200 and 300 mm, or between about 300 and 450 mm, or greater than about 450 mm, or any appropriately sized wafer. Moreover, the methods, apparatuses, and systems, may be used to fill features with tungsten on other types of substrates, including panels, display substrates, and the like.

As indicated above, a significant problem associated with the filling of semiconductor substrate structures and features with tungsten material is the formation of seams and voids during the tungsten fill process. In particular, structures having features characterizable as having one or more of narrow and/or re-entrant openings, or constrictions, or simply having relatively high aspect ratios may be problematic. FIG. 1A shows the cross-section of a vertical feature 101 in a substrate 103 which may be designed to be filled with tungsten material. Such a vertical feature has a feature opening 105 and sidewalls 107. The vertical feature 101 may have an aspect ratio of at least about 2:1, or at least about 4:1, or at least about 6:1, or at least about 10:1, or at least about 20:1, or even higher. The feature opening 105 may have a diameter of between about 10 nanometers to 500 nanometers, for example, between about 25 to 300 nanometers.

Likewise, FIG. 1B shows an example of a similar feature 101, but having a re-entrant profile, due to the presence of an under-layer 113 lining the bottom, sidewalls, and opening of feature 101. A re-entrant profile is one exhibiting a cross-sectional narrowing somewhere between the feature opening and the bottom or a closed end of the feature thereby exhibiting a "bottleneck" in the profile. In some cases, a re-entrant profile may narrow gradually from feature opening inward, or include an overhang right at the feature opening itself. FIG. 1B shows an example of the latter—again, wherein the narrowing is due to the presence of under-layer 113 which is thicker near the feature opening than on the bottom of the feature or further down the feature sidewalls 107, and thereby forms the overhang 115. The under-layer 113 may be, for example, a diffusion barrier layer, an adhesion layer, a nucleation layer, or any combination of the foregoing, or any other potentially useful or advantageous layer of material.

In some embodiments, one or more constrictions in the sidewalls of a feature may create difficulty in achieving uniform tungsten fill. FIG. 1C illustrates a top-down plan view of an example horizontal feature 121 exhibiting a constriction 109 roughly in the middle of its sidewall 107. In some embodiments, such horizontal features may be what is referred to as a "wordline" in a vertically integrated memory structure such as one of the 3-D vertical NAND (VNAND) structures described in more detail below. FIG. 1D illustrates a side-view of the same horizontal feature 121 having an opening 105 to vertical structure 122, and thus forming a part of vertical structure 122. In some embodiments, and for some deposition chemistries and processes, achieving uniform tungsten fill in such a structure may be challenging because a sufficient quantity of each species of deposition precursor must travel vertically down to the base of structure 122, and then horizontally through horizontal feature 121 and, in particular, through the region of constriction 109. Once again, note that FIG. 1C presents a top-down plan view representation of horizontal feature 121 and constriction 109, while FIG. 1D presents a side-view representation of the same. Thus, it is apparent from these figures that, in this embodiment, constriction 109 extends inward horizontally and vertically from sidewalls 107 of feature 121. However, it should be understood that, in other embodiments, constrictions within a feature may only be present in one of the two cross-sectional dimensions, and any type of constriction—whether it be in one or two dimensions—may make uniform tungsten fill more challenging.

In some embodiments, the structure to be filled on a semiconductor substrate may be a vertical structure having a plurality of horizontal features with openings in the sidewalls of the vertical structure—the openings leading to a plurality of interior volumes (of the horizontal features) which are fluidically accessible from the main vertical structure through the feature openings.

For instance, FIG. 2A presents a cross-sectional side-view of a 3D vertical memory NAND (VNAND) structure 200 (formed on a semiconductor substrate 201) having VNAND stacks (left 205 and right 206), central vertical structure 210, and a plurality of stacked horizontal features 220 with openings 230 on opposite sidewalls 240 of central vertical structure 210. Note that FIG. 2A displays two "stacks" of the exhibited VNAND structure, which together form the "trench-like" central vertical structure 210, however, in certain embodiments, there may be more than two "stacks" arranged in sequence and running spatially parallel to one another, the gap between each adjacent pair of "stacks" forming a central vertical structure 210, like that explicitly illustrated in FIG. 2A. In this embodiment, the horizontal features 220 are actually 3D memory "wordlines" which are fluidically accessible from vertical structure 210 through openings 230. Although not explicitly indicated in the figure, the horizontal features 220 present in both the VNAND stacks 205, 206 shown in FIG. 2A (i.e., the left VNAND stack 205 and the right VNAND stack 206) are also accessible from the other sides of the VNAND stacks (far left and far right, respectively) through similar vertical structures formed by additional VNAND stacks (to the far left and far right, but not shown). In other words, each VNAND stack 205, 206 contains a stack of wordlines which are fluidically accessible from both sides of the VNAND stack through a central vertical structure 210. In the particular example schematically illustrated in FIG. 2A, each VNAND stack contains 6 pairs of stacked wordlines, however, in other embodiments, a 3-D VNAND memory layout may contain 8, or 16, or 32, or 64 vertically stacked pairs of wordlines corresponding to 16, or 32, or 64, or 128 stacked horizontal wordline features 220 with openings 230. Moreover, in principle, any number of wordlines may be vertically stacked in such a VNAND structure so long as a technique is available to successfully accomplish (substantially) void-free fills of the vertical features. Thus, for example, a VNAND stack may include between 2 and 256 horizontal wordline features, or between 8 and 128 horizontal wordline features, or between 16 and 64 horizontal wordline features, and so forth (the listed ranges understood to include the recited end points).

Figure 2B:
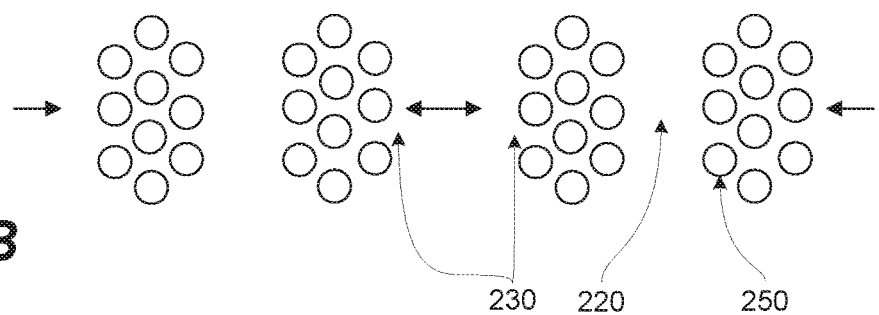
FIG. 2B presents a cross-sectional top-down view of the VNAND structure shown in side-view in FIG. 2A with the cross-section taken through the horizontal section indicated by the dashed horizontal line in FIG. 2A.

FIG. 2B presents a cross-sectional top-down view of the same VNAND structure 200 shown in side-view in FIG. 2A with the cross-section taken through the horizontal section 260 indicated in FIG. 2A (i.e., indicated by the dashed horizontal line). The cross-section of FIG. 2B illustrates several rows of pillars 250 which are shown in FIG. 2A to run vertically from the base of semiconductor substrate 201 to the top of VNAND stack 200. In some embodiments, these pillars 250 are formed from a polysilicon material and are structurally and functionally significant to VNAND structure 200. In some embodiments, such polysilicon pillars may serve as gate electrodes for stacked memory cells formed by the wordlines. The top-view of FIG. 2B illustrates that the pillars 250 form constrictions in the openings 230 to wordlines 220—i.e. fluidic accessibility of wordlines 220 from vertical structure 210 via openings 230 (as indicated by the arrows in FIG. 2B) is inhibited by pillars 250. In some embodiments, the size of the horizontal gap between adjacent polysilicon pillars is between about 1 and 20 nm. This reduction in fluidic accessibility increases the difficulty of uniformly filling wordlines 220 with tungsten material.

Figure 3A:
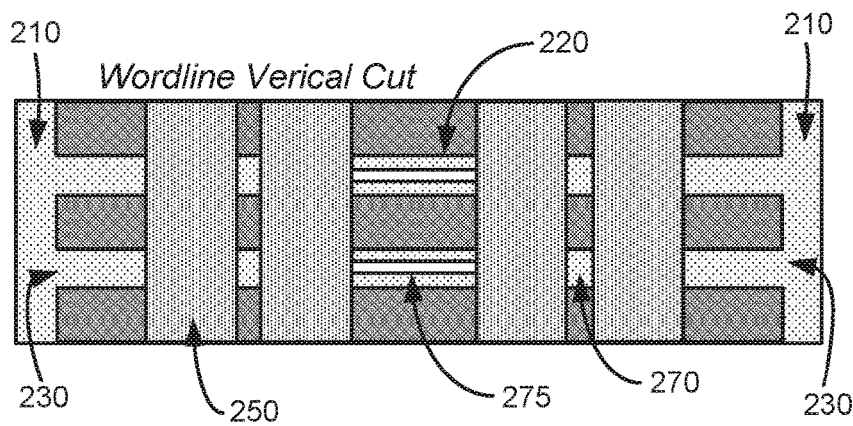
FIG. 3A exhibits a vertical cross-section (cut) of a VNAND structure similar to that shown in FIG. 2A, but in FIG. 3A focused on a single pair of wordlines and additionally schematically illustrating a tungsten fill process which resulted in the formation of voids in the wordlines.
Figure 3B:
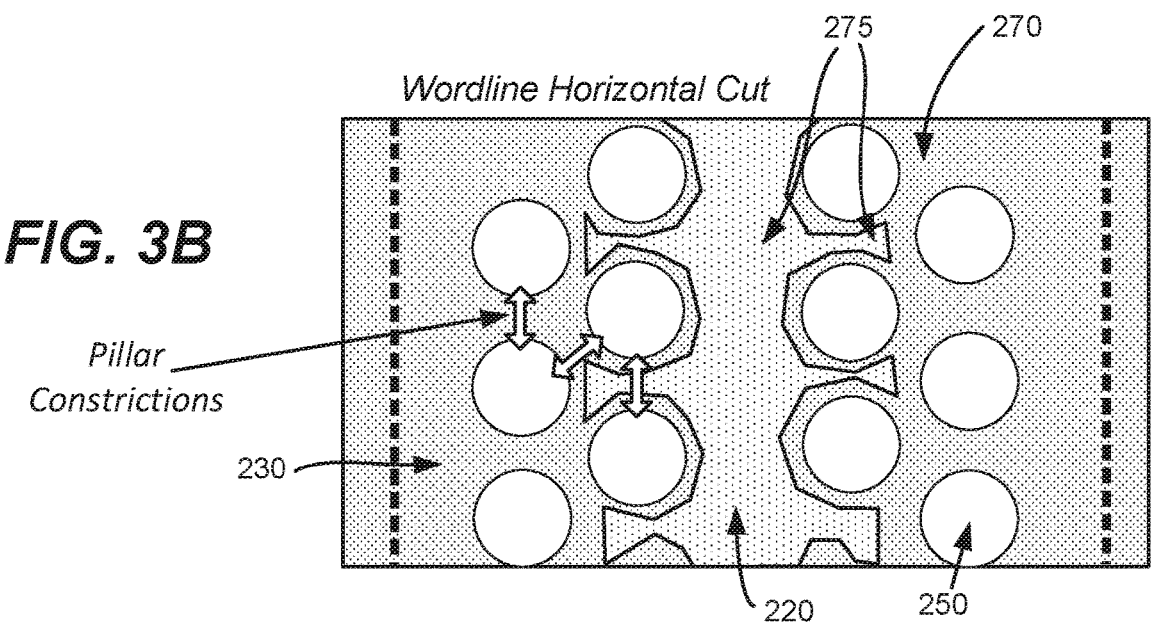
FIG. 3B exhibits a horizontal cross-section (cut) of a VNAND structure similar to that shown in FIG. 2A, and also schematically illustrating the presence of voids as in FIG. 3A.
Figure 3C:
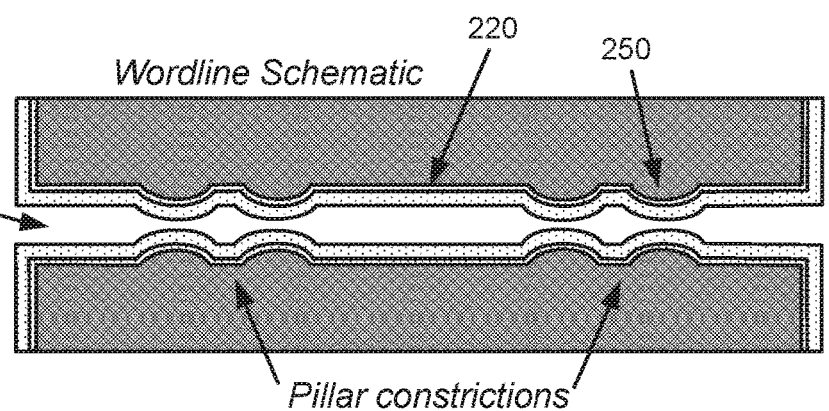
FIG. 3C exhibits a single wordline viewed cross-sectionally from above and illustrates how a generally conformal deposition of tungsten material begins to pinch-off the interior of exhibited wordline due presence of the pillars shown in the figure.

The structure of wordlines 220 and the challenge of uniformly filling them with tungsten material due to the presence of pillars 250 is further illustrated in FIGS. 3A, 3B, and 3C. FIG. 3A exhibits a vertical cut through VNAND structure 200 similar to that shown in FIG. 2A, but here focused on a single pair of wordlines 220 and additionally schematically illustrating a tungsten fill process which resulted in the formation of a voids 270 in wordlines 220. FIG. 3B also schematically illustrates the voids 270, but in this figure illustrated via a horizontal cut through pillars 250, similar to the horizontal cut exhibited in FIG. 2B. FIG. 3B illustrates the accumulation of tungsten material around the constriction-forming pillars 250, the accumulation resulting in the pinch-off of openings 230, so that no additional tungsten material can be deposited in the region of voids 270. Apparent from FIGS. 3A and 3B is that void-free tungsten fill relies on migration of sufficient quantities of deposition precursor down through vertical structure 210, through openings 230, past the constricting pillars 250, and into the furthest reaches of wordlines 220, prior to the accumulated deposition of tungsten around pillars 250 causing a pinch-off of the openings 230 and preventing further precursor migration into wordlines 220. Similarly, FIG. 3C exhibits a single wordline 220 viewed cross-sectionally from above and illustrates how a generally conformal deposition of tungsten material begins to pinch-off the interior of wordline 220 due to the fact that the significant width of pillars 250 acts to partially block, and/or narrow, and/or constrict what would otherwise be an open path through wordline 220. (It should be noted that the example in FIG. 3C can be understood as a 2-D rendering of the 3-D features of the structure of the pillar constrictions shown in FIG. 3B, thus illustrating constrictions that would be seen in a plan view rather than in a cross-sectional view.)

Accordingly, uniform deposition of tungsten containing material into constricted regions of semiconductor features can pose a significant challenge. While the examples described above specifically concern the problem of uniformly filing the memory wordlines of 3-D VNAND memory structures, the methods described herein can be applied to any sort of feature where there is a relatively constricted path from the source of the tungsten-containing material to the region of a feature where uniform tungsten deposition is desired.

One class of techniques for circumventing void formation and achieving uniform tungsten fill of horizontal features involves the combination of a tungsten deposition operation with a tungsten etch operation. The general idea is to deposit tungsten until pinch-off occurs, etch-back the pinch point to reopen the closed-off region, and then redeposit tungsten once again into the previously closed-off region. In some situations where such a technique may be employed, one intervening etch operation between a pair of deposition operations may be enough to complete a sufficiently uniform tungsten fill—even within certain horizontal features. However, in more challenging situations, additional deposition-etch cycles may be necessary for adequate fill—depending on the magnitude of a structure's aspect ratio, the degree of constriction within the horizontal feature to be filled, etc. Additional details regarding depositing tungsten using a combination of deposition and etch operations are described in U.S. patent application Ser. No. 14/285,505, filed May 22, 2014 and entitled "METHODS AND APPARATUSES FOR VOID-FREE TUNGSTEN FILL IN THREE-DIMENSIONAL SEMICONDUCTOR FEATURES," which is incorporated by reference in its entirety and for all purposes.

Boron Conversion

Figure 4:
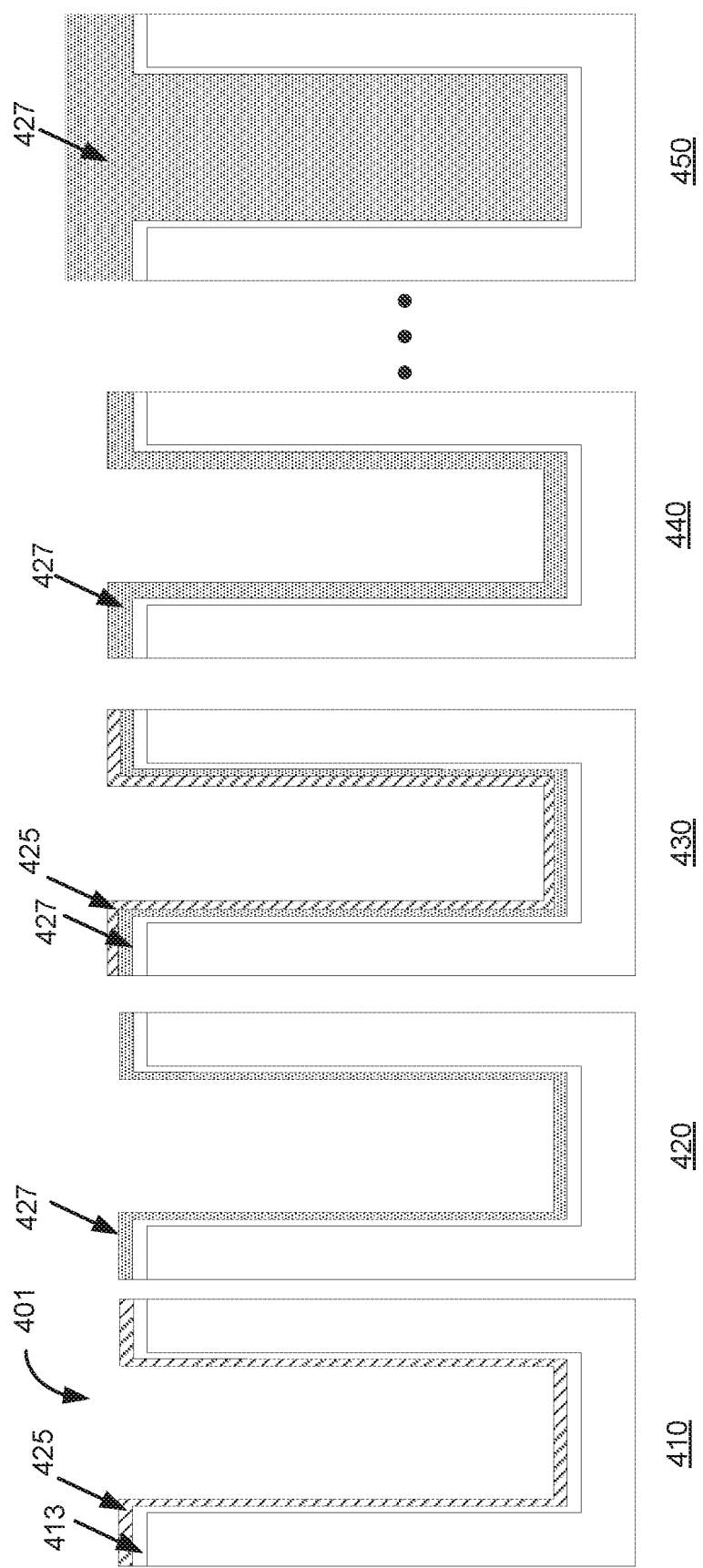
FIG. 4 is a schematic representation of a feature at various stages of feature fill employing boron conversion to tungsten.

In some implementations, tungsten deposition can include conformal boron deposition, followed by reduction of a tungsten-containing precursor (such as $WF_6$) by boron to form a layer of tungsten. An example reaction is: $WF_6(g)+2B(s) \rightarrow W(s)+BF_3(g)$. Tungsten deposition by boron conversion can occur in forming a tungsten nucleation layer or in filling a feature with tungsten. An example of feature fill by boron conversion is shown in FIG. 4. However, it is understood that boron conversion can serve to not only deposit tungsten for feature fill, but to also deposit tungsten as a nucleation layer and other purposes.

FIG. 4 shows a flow diagram illustrating certain operations in such a method of filling a feature by boron conversion. First, in an operation 410, a thin conformal layer of boron 425 is deposited in a feature 401 over a titanium nitride layer 413. In an operation 420, the thin conformal layer of boron 425 is converted to a tungsten layer 427, for example, by the reaction given above. The boron deposition and conversion operations are repeated at 430 and 440 to form another conformal layer of boron 425 that is then converted to tungsten, such that tungsten layer 427 grows. The deposition and conversion reactions can be repeated until the feature is completely filled with tungsten 427. The use of multiple cycles of thin conformal boron (or another reducing material) and conversion to tungsten to deposit very conformal, small grain and smoother tungsten can reduce the seam that may otherwise form using a CVD method that results in large or uneven grain growth. In some implementations, each cycle may form a tungsten layer having a thickness up to about 10 nm. There may be an increase in volume associated with the conversion from boron to tungsten.

Any boron-containing compound that can decompose or react to form a layer capable of reducing the tungsten-containing precursor to form elemental tungsten may be used. Examples include boranes including $B_nH_{n+4}$, $B_nH_{n+6}$, $B_nH_{n+8}$, $B_nH_m$, where n is an integer from 1 to 10, and m is a different integer than m.

In some implementations, layer 425 may be any material that is capable of reducing a tungsten precursor including a silicon or silicon-containing material, phosphorous or a phosphorous-containing material, germanium or a germanium-containing material, and hydrogen. Example precursors that can be used to form such layers include $SiH_4$, $Si_2H_6$, $PH_3$, $SiH_2Cl_2$, and $GeH_4$. Additional examples of using boron conversion in tungsten feature fill are described below.

Additional details regarding deposition of tungsten using boron-containing compounds are described in U.S. patent application Ser. No. 13/851,885, filed Mar. 27, 2013 and entitled "TUNGSTEN FEATURE FILL," which is incorporated by reference in its entirety and for all purposes.

Nucleation Layer Deposition

In some implementations, the methods described herein involve deposition of a tungsten nucleation layer prior to deposition of a bulk layer. A nucleation layer is typically a thin conformal layer that facilitates subsequent deposition of bulk tungsten-containing material thereon. According to various implementations, a nucleation layer may be deposited prior to any fill of the feature and/or at subsequent points during fill of the feature. For example, in some implementations, a nucleation layer may be deposited following etch of tungsten in a feature.

In certain implementations, the nucleation layer is deposited using a pulsed nucleation layer (PNL) technique. In a PNL technique, pulses of a reducing agent, optional purge gases, and tungsten-containing precursor are sequentially injected into and purged from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques. PNL techniques for depositing tungsten nucleation layers are described in U.S. Pat. Nos. 6,635,965; 7,005,372; 7,141,494; 7,589,017, 7,772,114, 7,955,972 and 8,058,170, and U.S. Patent Publication No. 2010-0267235, all of which are incorporated by reference herein in their entireties. Nucleation layer thickness can depend on the nucleation layer deposition method as well as the desired quality of bulk deposition. In general, nucleation layer thickness is sufficient to support high quality, uniform bulk deposition. Examples may range from 10 Å-100 Å.

While examples of PNL deposition are provided above, the methods described herein are not limited to a particular method of tungsten nucleation layer deposition, but include deposition of bulk tungsten film on tungsten nucleation layers formed by any method including PNL, ALD, CVD, and physical vapor deposition (PVD). Moreover, in certain implementations, bulk tungsten may be deposited directly in a feature without use of a nucleation layer. For example, in some implementations, the feature surface and/or an already-deposited under-layer supports bulk tungsten deposition. In some implementations, a bulk tungsten deposition process that does not use a nucleation layer may be performed. U.S. patent application Ser. No. 13/560,688, filed Jul. 27, 2012, incorporated by reference herein, describes deposition of a tungsten bulk layer without a nucleation layer, for example.

In various implementations, tungsten nucleation layer deposition can involve exposure to a tungsten-containing precursor such as tungsten hexafluoride ($WF_6$), tungsten hexachloride ($WCl_6$), and tungsten hexacarbonyl ($W(CO)_6$). In certain implementations, the tungsten-containing precursor is a halogen-containing compound, such as $WF_6$. Organo-metallic precursors, and precursors that are free of fluorine such as MDNOW (methylcyclopentadienyl-dicarbonylnitrosyl-tungsten) and EDNOW (ethylcyclopentadienyl-dicarbonylnitrosyl-tungsten) may also be used.

Examples of reducing agents can include boron-containing reducing agents including diborane ($B_2H_6$) and other boranes, silicon-containing reducing agents including silane ($SiH_4$) and other silanes, hydrazines, and germanes. In some implementations, pulses of tungsten-containing precursors can be alternated with pulses of one or more reducing agents, e.g., S/W/S/W/B/W, etc., W represents a tungsten-containing precursor, S represents a silicon-containing precursor, and B represents a boron-containing precursor. In some implementations, a separate reducing agent may not be used, e.g., a tungsten-containing precursor may undergo thermal or plasma-assisted decomposition.

PNL tungsten film properties can be substantially altered by the choice and introduction sequence of process gases. In particular, it is advantageous to begin PNL tungsten deposition with a single dose of a boron-containing reducing agent (e.g., $B_2H_6$) prior to the first dose of tungsten-containing gas (e.g., $WF_6$). After the initial doses of $B_2H_6$—$WF_6$, the remaining cycles of PNL tungsten deposition can proceed as described above (e.g., alternating $SiH_4$ and $WF_6$ pulses).

In this approach, the diborane (or other boron-containing precursor) reacts on a substrate surface to form a "sacrificial layer" of elemental boron. This sacrificial layer subsequently reacts with a tungsten precursor to form elemental tungsten. The boron deposition process is not a conventional self-limiting ALD type deposition process (contrast silane-based reactions for example). Rather, the diborane (or other suitable boron-containing material) decomposes thermally to produce a boron film under typical PNL or CVD operating conditions (e.g., 200° C.–400° C., 1-300 Torr) on the dielectric surface. The reaction can proceed so long as the substrate is exposed to boron reducing agent. However, to ensure that a limited amount of tungsten is actually formed in the subsequent step, the diborane deposition is preferably limited to a thickness of between about 3 and 10 angstroms. This may correspond to about one to three monolayers of diborane. In the second operation of the process, the elemental boron layer is exposed to a tungsten precursor, which is reduced by the boron to elemental tungsten.

In some embodiments, the boron operation is performed at a moderate temperature (e.g., 300° C.) in order to ensure that a sufficient quantity of boron is formed on the surface in a reasonable amount of time. Regarding other parameters, generally the process steps are performed at a pressure of between about 0.1 and 300 Torr and the doses are defined by the flow rates and contact time. Generally, the boron-containing reducing agent can be any process-compatible boron compound capable of effectively reducing a tungsten precursor to produce a layer of metallic tungsten. Examples of suitable boron-containing reducing agents include boranes such as hexaborane ($B_6H_{10}$), triborane, diborane ($B_2H_6$), etc.

Measurements indicate first order boron growth kinetics from $B_2H_6$ with an activation energy of roughly 200 kJ/gmol. Thus a very thin boron film can be deposited as a sacrificial layer prior to the first $WF_6$ or other W containing reagent pulse. The amount of B on the surface is tailored to provide adequate nucleation sites for $WF_6$ to begin nucleation and tungsten growth on all surfaces of the wafer. This dramatically reduces the sensitivity of the PNL process to variations in the incoming semiconductor wafers substrate. In particular, with a properly optimized B layer from the first $B_2H_6$ pulse, one can even nucleate tungsten on wafer surfaces with discontinuous Ti—TiN line-barrier films. In extremely high aspect ratio semiconductor contact structures for logic and DRAM devices this is very important, because poor step coverage from PVD or CVD Ti and TiN barriers often creates discontinuous films near the bottom of contacts when the aspect ratios of the contacts exceed 10:1 (depth/diameter).

$B_2H_6$ is not without faults as a reducing agent for PNL tungsten. Because $B_2H_6$ deposits by a thermal CVD process and is not self-limiting, it is possible to have step coverage problems with boron deposition from $B_2H_6$. This is typically not seen for features with aspect ratios less than 20:1, but may be an issue for aggressive (DRAM) structures with aspect ratios of 60:1 or more. $SiH_4$ is self-limiting and can fully saturate any topography given sufficient dose times. Therefore, a typical PNL tungsten growth may begin with an initial pulse of $B_2H_6$ and follow that with alternating doses of $WF_6$ and $SiH_4$. $B_2H_6$ dose time may be optimized to provide adequate nucleation sites for subsequent tungsten growth. The boron may also serve as a getter to consume excess fluorine generated by the decomposition of $WF_6$. Subsequent doses of $WF_6$ and $SiH_4$ are self-limiting and result in uniform and totally conformal tungsten film growth.

Bulk Deposition

In many implementations, tungsten bulk deposition can occur by a CVD process in which a reducing agent and a tungsten-containing precursor are flowed into a deposition chamber to deposit a bulk fill layer in the feature. An inert carrier gas may be used to deliver one or more of the reactant streams, which may or may not be pre-mixed. Unlike PNL or ALD processes, this operation generally involves flowing the reactants continuously until the desired amount is deposited. In certain implementations, the CVD operation may take place in multiple stages, with multiple periods of continuous and simultaneous flow of reactants separated by periods of one or more reactant flows diverted.

Various tungsten-containing gases including, but not limited to, $WF_6$, $WCl_6$, and $W(CO)_6$ can be used as the tungsten-containing precursor. In certain implementations, the tungsten-containing precursor is a halogen-containing compound, such as $WF_6$. In certain implementations, the reducing agent is hydrogen gas, though other reducing agents may be used including silane ($SiH_4$), disilane ($Si_2H_6$) hydrazine ($N_2H_4$), diborane ($B_2H_6$) and germane ($GeH_4$). In many implementations, hydrogen gas is used as the reducing agent in the CVD process. In some other implementations, a tungsten precursor that can decompose to form a bulk tungsten layer can be used. Bulk deposition may also occur using other types of processes including ALD processes.

Examples of temperatures may range from 200° C. to 500° C. According to various implementations, any of the CVD W operations described herein can employ a low temperature CVD W fill, e.g., at about 250° C.-350° C. or about 300° C.

Deposition may proceed according to various implementations until a certain feature profile is achieved and/or a certain amount of tungsten is deposited. In some implementations, the deposition time and other relevant parameters may be determined by modeling and/or trial and error. For example, for an initial deposition for an inside out fill process in which tungsten can be conformally deposited in a feature until pinch-off, it may be straightforward to determine based on the feature dimensions the tungsten thickness and corresponding deposition time that will achieve pinch-off. In some implementations, a process chamber may be equipped with various sensors to perform in-situ metrology measurements for end-point detection of a deposition operation. Examples of in-situ metrology include optical microscopy and X-Ray Fluorescence (XRF) for determining thickness of deposited films.

It should be understood that the tungsten films described herein may include some amount of other compounds, dopants and/or impurities such as nitrogen, carbon, oxygen, boron, phosphorous, sulfur, silicon, germanium and the like, depending on the particular precursors and processes used. The tungsten content in the film may range from 20% to 100% (atomic) tungsten. In many implementations, the films are tungsten-rich, having at least 50% (atomic) tungsten, or even at least about 60%, 75%, 90%, or 99% (atomic) tungsten. In some implementations, the films may be a mixture of metallic or elemental tungsten (W) and other tungsten-containing compounds such as tungsten carbide (WC), tungsten nitride (WN), etc.

CVD and ALD deposition of these materials can include using any appropriate precursors. For example, CVD and ALD deposition of tungsten nitride can include using halogen-containing and halogen-free tungsten-containing and nitrogen-containing compounds as described further below. CVD and ALD deposition of titanium-containing layers can include using precursors containing titanium with examples including tetrakis(dimethylamino)titanium (TDMAT) and titanium chloride ($TiCl_4$), and if appropriate, one or more co-reactants. CVD and ALD deposition of tantalum-containing layers can include using precursors such as pentakis-dimethylamino tantalum (PDMAT) and $TaF_5$ and, if appropriate, one or more co-reactants. CVD and ALD deposition of cobalt-containing layers can include using precursors such as Tris(2,2,6,6-tetramethyl-3,5-heptanedionato)cobalt, bis(cyclopentadienyl)cobalt, and dicobalt hexacarbonyl butylacetylene, and one or more co-reactants. CVD and ALD deposition of nickel-containing layers can include using precursors such as cyclopentadienylallylnickel (CpAllylNi) and $MeCp_2Ni$. Examples of co-reactants can include $N_2$, $NH_3$, $N_2H_4$, $N_2H_6$, $SiH_4$, $Si_3H_6$, $B_2H_6$, $H_2$, and $AlCl_3$.

Distribution of a material within a feature may also be characterized by its step coverage. For the purposes of this description, "step coverage" is defined as a ratio of two thicknesses, i.e., the thickness of the material inside the feature divided by the thickness of the material near the opening. For purposes of this document, the term "inside the feature" represents a middle portion of the feature located about the middle point of the feature along the feature's axis, e.g., an area between about 25% and 75% of the distance or, in certain embodiments, between about 40% and 60% of the distance along the feature's depth measured from the feature's opening, or an end portion of the feature located between about 75% and 95% of the distance along the feature's axis as measured from the opening. The term "near the opening of the feature" or "near the feature's opening" represents a top portion of the feature located within 25% or, more specifically, within 10% of the opening's edge or other element representative of the opening's edge. Step coverage of over 100% can be achieved, for example, by filling a feature wider in the middle or near the bottom of the feature than at the feature opening.

In certain embodiments, a targeted step coverage of the etched layer is at least about 60%, 75%, 100%, or super-conformal (over 100%), such as 125%. In certain embodiments, a step coverage below about 50%, 25% or less may be targeted.

Diborane with a Hydrogen Balance

As discussed earlier, uniform deposition of tungsten in horizontal wordline features of a 3-D VNAND structure may pose significant challenges. With larger and larger aspect ratios and more and more stacked horizontal wordlines in a 3-D VNAND structure, a precursor gas may have to travel farther and through more constricted paths to regions where uniform tungsten deposition is desired. Challenges associated with uniform deposition of tungsten in 3-D VNAND structures are discussed with respect to FIGS. 1A-1D, 2A-2B, and 3A-3C.

The present disclosure relates to deposition of a transition metal, such as tungsten molybdenum, ruthenium, or cobalt, in horizontally-oriented features of a vertical structure of a semiconductor substrate. A semiconductor substrate may include a vertical structure, such as a 3-D vertical NAND structure. The semiconductor substrate may further include a plurality of horizontally-oriented features, such as word-lines in a 3-D vertical NAND structure. The horizontally-oriented features may include constrictions. The semiconductor substrate may include the vertical structure having the plurality of horizontally-oriented features with openings in sidewalls of the vertical structure that are fluidically accessible from the vertical structure through the openings. An example of vertical structures with a plurality of horizontally-oriented features is shown in FIGS. 2A-2B.

Deposition of void-free tungsten fill, or other transition metal fill, relies in part on migration of sufficient quantities of precursor gas down through the vertical structure, through openings in sidewalls of the vertical structure, past constricting pillars, and into the plurality of horizontally-oriented features. The vertical structure and the plurality of horizontally-oriented features may have high aspect ratios. In some implementations, the horizontally-oriented features may have depths on the order of a few microns to several microns. The plurality of horizontally-oriented features may provide large surface areas for which uniform transition metal deposition is desired. Accordingly, providing sufficient quantities of precursor gas to travel long distances past constricting barriers to saturate large surface areas in a semiconductor substrate may present significant challenges.

Diborane may react on a substrate surface to form a "sacrificial layer" of elemental boron that subsequently reacts with a metal precursor to form a metal layer, where the elemental boron acts as a reducing agent. Deposition of diborane on the substrate surface is not a self-limiting process and typically results in poor step coverage of the metal layer on the substrate surface. Poor step coverage may result in non-uniform deposition of the metal layer and the formation of voids in a metal fill. In addition, the diborane is typically delivered with a nitrogen ($N_2$) balance that limits the diborane concentration. For example, diborane is provided with a nitrogen balance where the limits of diborane concentration is equal to or less than about 5% by volume of diborane. Having such a limit on diborane concentration may be due at least in part to controlling the stability of diborane so as to limit diborane decomposition. With such limits on diborane concentration, very high flows and/or very long dose times are needed to deliver a sufficient dose to the substrate to cover large surface areas and provide adequate nucleation sites for subsequent metal (e.g., tungsten) growth. Higher gas flows and longer dose times adversely affect gas usage and throughput.

Instead of having a diborane gas supply in which diborane is supplied with a nitrogen balance, the present disclosure relates to having a diborane gas supply in which diborane is supplied with a hydrogen ($H_2$) balance. Prior to entering a deposition chamber, a boron-containing gas mixture may be provided, where the boron-containing gas mixture includes diborane and hydrogen. The hydrogen is not pulsed separately than the diborane, such as having hydrogen pulsed as a purge gas subsequent to the diborane. The hydrogen is also not delivered from a separate gas line or separate gas supply into the deposition chamber, such as having hydrogen delivered with the diborane as a carrier gas. The diborane is delivered together into the deposition chamber with hydrogen as a co-reactant with the diborane, where the diborane is balanced with the hydrogen in a gas mixture. In some implementations, the diborane is stored together with the hydrogen in a gas supply prior to delivery to the deposition chamber.

The gas mixture of diborane and hydrogen may provide a higher diborane concentration than a gas mixture of diborane and nitrogen. In some implementations, the gas mixture includes at least 20% by volume of diborane with a hydrogen balance. In some implementations, the gas mixture includes between about 20%-50% by volume of diborane with a hydrogen balance. The higher diborane concentration leads to a higher partial pressure dose of diborane delivered to a semiconductor substrate. The higher partial pressure dose of diborane allows a greater quantity of diborane to reach into a plurality of horizontally-oriented features of a vertical structure and saturate large surface areas. For example, the higher partial pressure dose of diborane may facilitate a greater quantity of diborane reaching a plurality of horizontal wordline features in a 3-D vertical NAND structure. This can be done without necessarily increasing gas flows and dose time.

Figure 5:
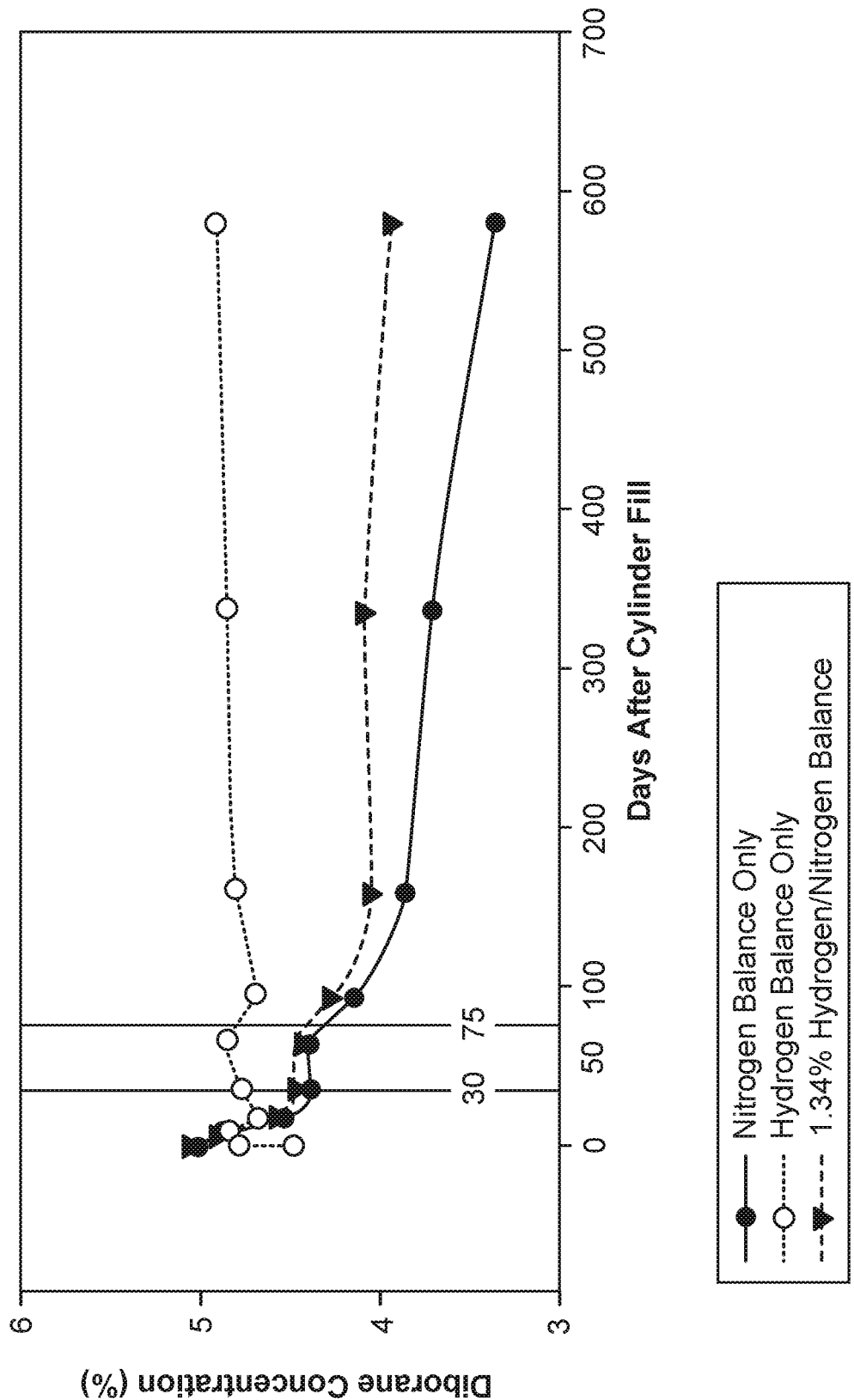
FIG. 5 is a graph illustrating diborane concentration as a function of days where the diborane is balanced with nitrogen, with hydrogen, or with a mixture of hydrogen and nitrogen.

Providing a balance of hydrogen with diborane stabilizes the diborane to limit decomposition of diborane. Diborane will form elemental boron and hydrogen gas upon decomposition: $B_2H_6 \leftrightarrow 2B_{(s)} + 3H_{2(g)}$. Because the decomposition of diborane is a reversible reaction, adding hydrogen slows down the decomposition of diborane. FIG. 5 shows a graph of diborane concentration across hundreds of days, where diborane is mixed with a balance of nitrogen, with a balance of hydrogen, or with a balance of hydrogen and nitrogen. As shown in FIG. 5, a balance of nitrogen with diborane can lead to reduced diborane concentration from 5% by volume of diborane to 4.5% by volume of diborane in about a month, whereas a balance of hydrogen with diborane may maintain the diborane concentration at about 5% by volume of diborane over a few years.

Diborane is capable of pyrolysis to produce higher boranes. Diborane may dissociate into borane as shown below, and the borane may serve as a reaction intermediate that undergoes a series of reactions to result in a higher boranes and molecular hydrogen. Further steps can give rise to successively higher boranes. The higher boranes produced by pyrolysis may reduce hardware lifetimes of systems and apparatuses that store diborane. The higher boranes may eventually decompose to form elemental boron and hydrogen.

$$B_2H_6 \leftrightarrow 2BH_3 \quad (1)$$

$$B_2H_6 + BH_3 \leftrightarrow B_3H_9 \quad (2)$$

$$B_3H_9 \leftrightarrow B_3H_7 + H_2 \text{ (rate determining step)} \quad (3)$$

$$BH_3 + B_3H_7 \leftrightarrow B_4H_{10} \quad (4)$$

$$B_2H_6 + B_3H_7 \leftrightarrow B_5H_{11} + H_2 \quad (5)$$

The addition of hydrogen with diborane in a gas mixture may slow down the pyrolysis of diborane. Thus, diborane with a balance of hydrogen stabilizes the diborane from decomposing. The diborane may be slowed from decomposing when stored, delivered, and adsorbed on a substrate surface.

Deposition of diborane on a substrate surface is not a self-limiting process. Accordingly, unlike other reducing agents, the decomposition of diborane to elemental boron is not a self-limiting reaction. Instead of being limited to a number of reactive sites on the substrate surface, boron may be continuously formed on the substrate surface by decomposition of diborane. Typically, deposition of boron by decomposition of diborane leads to poor step coverage due in part to not being a self-limiting process. However, the addition of hydrogen to balance diborane slows down the decomposition so that deposition of boron can have improved step coverage.

Using diborane with a balance of hydrogen, a boron layer may be formed on the substrate surface that serves as a reducing agent in converting a metal precursor to metal. This can occur in any part of a sequence for filling a feature with metal (e.g., tungsten). That way, diborane may be deposited prior to, during, or after bulk metal filling of a feature. In some implementations, diborane may be deposited in a "soak" process or PNL process prior to bulk metal filling. In some implementations, diborane may be deposited in a soak process or PNL process during bulk metal filling when the bulk metal filling is partially complete. In some implementations, multiple soak cycles and/or nucleation cycles may be combined prior to or during bulk metal filling of a feature. In some implementations, diborane may be deposited in a CVD process with a metal precursor for bulk metal filling of a feature.

A "soak" or "initiation soak" process may precondition a substrate surface by exposing the substrate to a gas, which promotes the growth of metal with no nucleation delay. In some implementations, a soak process may expose the substrate surface to a gas such as diborane in a gaseous state for about 1 to about 60 seconds. By way of an example, a soak process can include a single pulse of diborane (and purge) prior to a pulsed nucleation process. This establishes a boron layer as a reducing agent on the substrate surface, which can reduce or eliminate nucleation delays by providing an optimal surface for metal nucleation regardless of the adhesion layer applied during prior processing of the substrate (such as a Ti—TiN layer). Note that a soak step can be viewed as an initial cycle, such as a long initial diborane dose employed to improve nucleation density and reduce nucleation delay.

A pulsed nucleation process may use a PNL technique to deposit a thin conformal metal layer that facilitates subsequent bulk metal deposition. In a pulsed nucleation process, pulses of diborane or silane, optional purge gases, and metal precursor are sequentially injected into and purged from the deposition chamber. The process is repeated until a desired thickness is achieved. In some implementations, a soak step and a pulsed nucleation step may be combined before or during bulk metal filling of a feature. The soak step and the pulsed nucleation step may occur in any sequence and any number of times before or during bulk metal filling of a feature. In terms of sequence, a soak process may be followed by a pulsed nucleation process, or a pulsed nucleation process may be followed by a soak process. Examples of various sequences in depositing tungsten are shown in FIGS. 6A-6D.

Figure 6A:
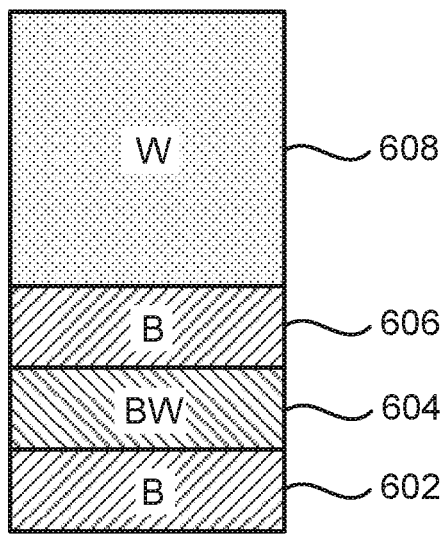
FIGS. 6A-6D schematically illustrate various tungsten stacks deposited according to different sequences.

FIG. 6A shows a schematic representation of a tungsten stack formed according to a sequence of soak, pulsed nucleation, and bulk filling operations. The tungsten stack in FIG. 6A may be formed according to a B/BW/B/W sequence of operations, where B represents a soak step, BW represents a diborane pulsed nucleation step, and W represents a bulk tungsten fill step. In FIG. 6A, an initial soak step can deposit diborane to establish a first boron layer 602 that serves as a reducing agent for a tungsten-containing precursor, where the tungsten-containing precursor may be provided as a reactant in a subsequent step. A subsequent pulsed nucleation step can sequentially pulse diborane, optional purge gases, and a tungsten-containing precursor to form a tungsten nucleation layer 604. A subsequent soak step can further deposit diborane over the tungsten nucleation layer 604. The deposited diborane may establish a second boron layer 606 that serves as a reducing agent for a tungsten-containing precursor, where the tungsten-containing precursor may be provided as a reactant in a subsequent step. A subsequent bulk tungsten fill step can use a CVD technique to flow reactants of a reducing agent and a tungsten-containing precursor simultaneously and continuously until a desired amount of tungsten 608 is deposited.

Figure 6B:
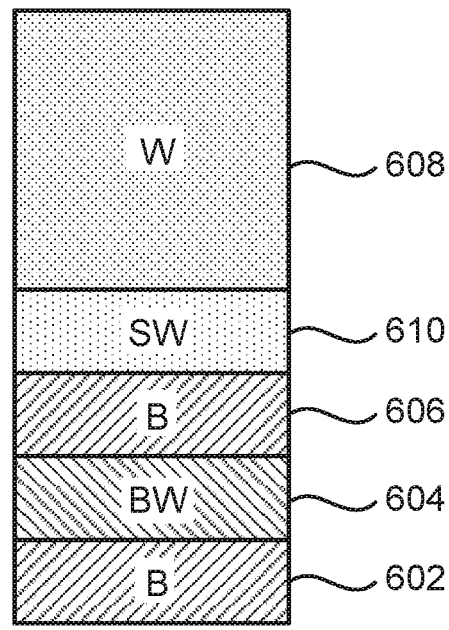

FIG. 6B shows a schematic representation of a tungsten stack formed according to another sequence of soak, pulsed nucleation, and bulk filling operations. The tungsten stack in FIG. 6B may be formed according to a B/BW/B/SW/W sequence of operations, where SW represents a silane pulsed nucleation step. Like FIG. 6A, an initial soak step is followed by a pulsed nucleation step using diborane, which is followed by a subsequent soak step. Unlike FIG. 6A, however, FIG. 6B adds a subsequent pulsed nucleation step that sequentially pulses silane, optional purge gases, and a tungsten-containing precursor to form an intermediate tungsten nucleation layer 610. A subsequent bulk tungsten fill step can use a CVD technique to flow reactants of a reducing agent and a tungsten-containing precursor simultaneously and continuously until a desired amount of tungsten 608 is deposited.

Figure 6C:
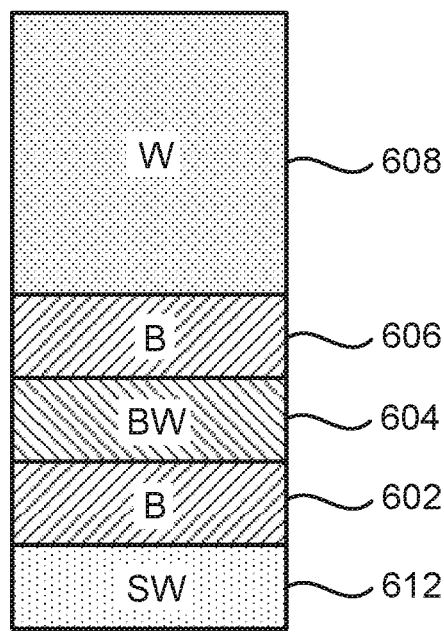

FIG. 6C shows a schematic representation of a tungsten stack formed according to another sequence of soak, pulsed nucleation, and bulk filling operations. The tungsten stack in FIG. 6C may be formed according to a SW/B/SW/B/W sequence of operations. Like FIG. 6A, an initial soak step is followed by a pulsed nucleation step using diborane, which is followed by a subsequent soak step, and which is followed by a subsequent bulk tungsten fill step. Unlike FIG. 6A, however, FIG. 6C adds an initial pulsed nucleation step that sequentially pulses silane, optional purge gases, and a tungsten-containing precursor to form an initial tungsten nucleation layer 612 prior to an initial soak step.

Figure 6D:
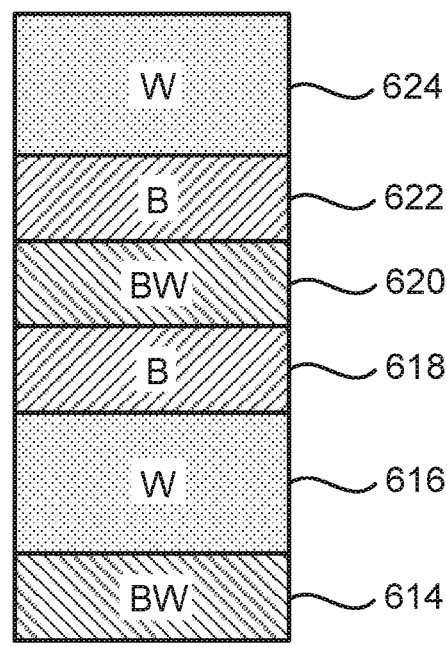

FIG. 6D shows a schematic representation of a tungsten stack formed according to another sequence of soak, pulsed nucleation, and bulk filling operations. The tungsten stack in FIG. 6D may be formed according to a BW/W/B/BW/B/W sequence of operations. In FIG. 6D, an initial pulsed nucleation step can sequentially pulse diborane, optional purge gases, and a tungsten-containing precursor to form a first tungsten nucleation layer 614. A subsequent bulk tungsten fill step can use a CVD technique to flow reactants of a reducing agent and a tungsten-containing precursor simultaneously and continuously until a desired amount of tungsten 616 is formed. The desired amount of tungsten 616 formed during this step may only partially complete the bulk tungsten filling process. A subsequent soak step can deposit diborane to establish a first boron layer 618 that serves as a reducing agent for a tungsten-containing precursor, where the tungsten-containing precursor may be provided as a reactant in a subsequent step. Such a step may "interrupt" the bulk tungsten filling process. Put another way, diborane may be deposited in a soak step and/or a pulsed nucleation step when the bulk tungsten filling process is not entirely complete. A subsequent pulsed nucleation step can sequentially pulse diborane, optional purge gases, and a tungsten-containing precursor to form a second tungsten nucleation layer 620. A subsequent soak step can further deposit diborane over the second tungsten nucleation layer 620. The deposited diborane may establish a second boron layer 622 that serves as a reducing agent for a tungsten-containing precursor, where the tungsten-containing precursor may be provided as a reactant in a subsequent step. A subsequent bulk tungsten fill step can use a CVD technique to flow reactants of a reducing agent and a tungsten-containing precursor simultaneously and continuously until a desired amount of tungsten 624 is deposited.

Figure 7:
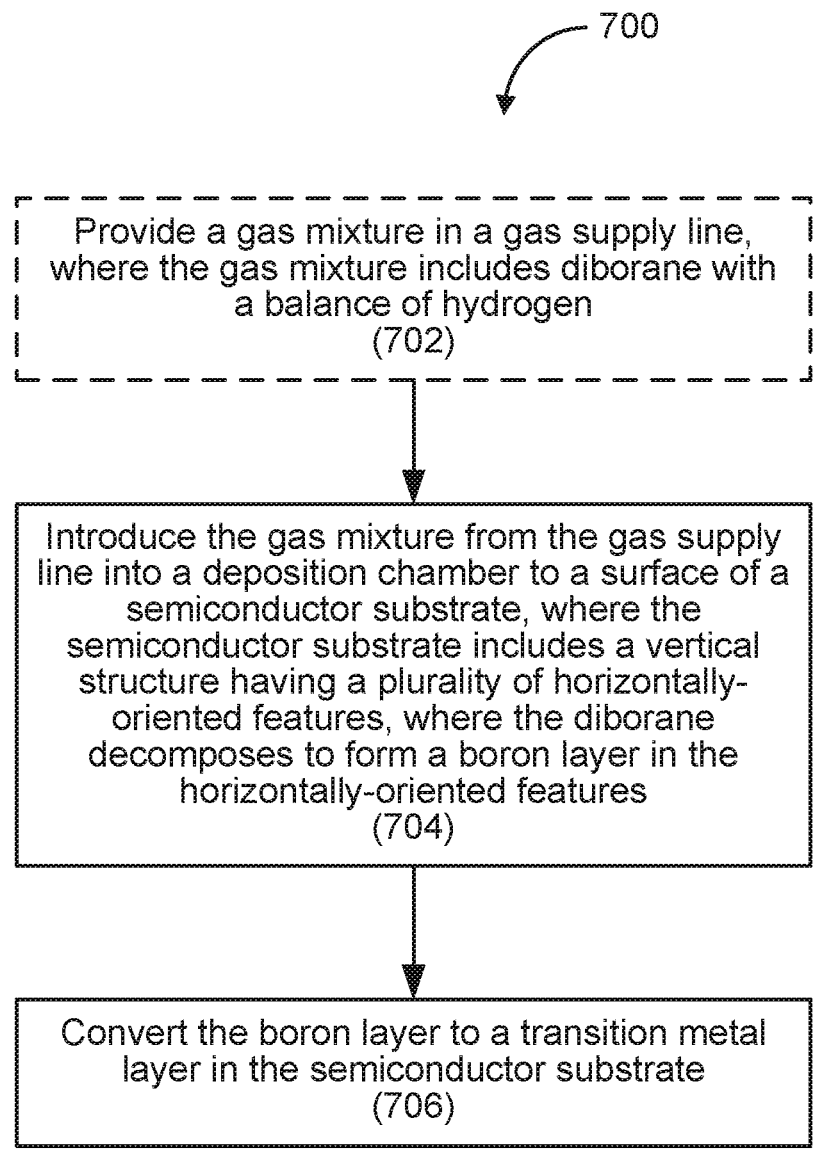
FIG. 7 is a flow diagram illustrating an example method of depositing a transition metal layer using diborane with a balance of hydrogen.

FIG. 7 shows a flow diagram illustrating an example method of depositing a transition metal layer using diborane with a balance of hydrogen. The process 700 may be performed in a different order or with different, fewer, or additional operations. In some implementations, the blocks of the process 700 may be performed using a system controller described below. In some implementations, the blocks of the process 700 may be implemented, at least in part, according to software stored on one or more non-transitory computer readable media.

The process 700 relates to delivery of diborane to a substrate surface for depositing metal in a plurality of horizontally-oriented features in a vertical structure. The diborane is delivered in a gas mixture having diborane balanced with hydrogen. Diborane delivery and conversion to metal may be a step in a sequence of steps for depositing metal in a feature.

At block 702 of the process 700, a gas mixture is optionally provided in a gas supply line, where the gas mixture includes diborane with a balance of hydrogen. Rather than providing diborane with a balance of nitrogen, diborane may be provided with a balance of hydrogen. With a balance of nitrogen, the concentration of diborane is limited (e.g., 5% by volume or less), a hardware lifetime is reduced, and step coverage on a substrate surface is poor. With a balance of hydrogen, however, the concentration of diborane is increased (e.g., 20% by volume or greater), a hardware lifetime is increased, and step coverage on a substrate surface is improved.

The gas supply line may be coupled to a deposition chamber for depositing a transition metal on a substrate surface. Diborane with the balance of hydrogen is provided from a common source prior to delivery into the deposition chamber. In some implementations, the gas mixture is substantially free of nitrogen.

At block 704 of the process 700, the gas mixture is introduced from the gas supply line into a deposition chamber to a surface of a semiconductor substrate. The semiconductor substrate includes a vertical structure having a plurality of horizontally-oriented features. The diborane decomposes to form a boron layer in the horizontally-oriented features. In some implementations, the diborane balanced with hydrogen may be flowed with a suitable inert carrier gas such as hydrogen, nitrogen, or argon.

In some implementations, the vertical structure includes a 3-D vertical NAND structure. In some implementations, the plurality of horizontally-oriented features may include horizontal wordline features. The horizontal wordline features may have high aspect ratios, where the aspect ratio of a horizontal wordline feature may represent a ratio of a depth or length (L) of the wordline feature against a height (h) of the gap of the wordline feature. For a single stairway contact scheme, the aspect ratio may be calculated as L:2h, whereas for a double stairway contact scheme, the aspect ratio may be calculated as L:h. In some implementations, the horizontal wordline features may have aspect ratios of at least about 4:1, or at least about 6:1, or at least about 10:1, or at least about 20:1, or at least about 60:1, or even higher. In some implementations, the horizontal wordline features may have depths on the order of a few microns to several microns. The horizontal wordline features may include constrictions. In some implementations, the semiconductor substrate may include the vertical structure having the plurality of horizontally-oriented features with openings in sidewalls of the vertical structure that are fluidically accessible from the vertical structure through the openings. An example of vertical structures with a plurality of horizontally-oriented features is shown in FIGS. 2A-2B.

A concentration of a diborane dose may be high in order to effectively deposit in 3-D vertical NAND structures that have high surface area. The diborane balanced with hydrogen delivers an increased dose of diborane without necessarily having to increase gas flows and dose times. Thus, sufficient quantities of diborane may be deposited throughout the 3-D vertical NAND structures and into the furthest reaches of the horizontal wordline features. The deposited diborane may undergo thermal decomposition and form a boron layer in the horizontally-oriented features, where the boron layer acts as a reducing agent. Due in part to hydrogen slowing down the decomposition of diborane into elemental boron, the boron layer may be conformally deposited in the horizontally-oriented features of the vertical structure, where the step coverage of the boron layer is at least 70%, at least 80%, at least 85%, at least 90%, or at least 95%.

In some implementations, the semiconductor substrate is exposed to a pulse of the diborane balanced with hydrogen in a PNL cycle for a period of time, such as between about 0.1 seconds and about 10 seconds. The pulse may optionally be followed by a purge with a suitable purge gas such as hydrogen, nitrogen, or argon. In some implementations, the purge gas may be running in the background throughout the PNL cycle. The diborane on the semiconductor substrate decomposes to form the boron layer. The semiconductor substrate may be subsequently exposed to a transition metal precursor, such as a tungsten-containing precursor, in the PNL cycle for a period of time. In some implementations, such a period of time may be between about 0.1 seconds and about 10 seconds.

In some implementations, the semiconductor substrate is exposed to a "soak" of the diborane balanced with hydrogen for a period of time, such as between about 1 second and about 60 seconds. The diborane may be in a gaseous state. The pulse may optionally be followed by a purge with a suitable purge gas such as hydrogen, nitrogen, or argon.

At block 706 of the process 700, the boron layer is converted to a transition metal layer in the semiconductor substrate. For example, the transition metal layer can include molybdenum, ruthenium, cobalt, or tungsten. In some implementations, the semiconductor substrate is exposed to a transition metal precursor, such as a tungsten-containing precursor. In some implementations, the tungsten-containing precursor includes tungsten hexafluoride ($WF_6$), tungsten hexachloride ($WCl_6$), or tungsten hexacarbonyl ($W(CO)_6$). The tungsten-containing precursor may be reduced by the boron layer to form elemental tungsten. In some implementations, the transition metal layer may be conformally deposited in the horizontally-oriented features of the vertical structure, where a step coverage of the transition metal layer is at least 85%, at least 90%, or at least 95%.

In some implementations, the process 700 further includes exposing the semiconductor substrate to a reducing gas, where the reducing gas includes silane, disilane, or hydrogen. In some implementations, a silane reducing gas may be deposited in a conventional PNL process. The silane reducing gas contacts the substrate for a period of between about 0.1 seconds and about 10 seconds, and is then purged from the deposition chamber using a purge gas. The silane reducing gas may convert a transition metal precursor to metal. In some implementations, a silane reducing gas, disilane reducing gas, or hydrogen reducing gas is used in a CVD process for bulk deposition of metal.

Apparatus

Figure 8:
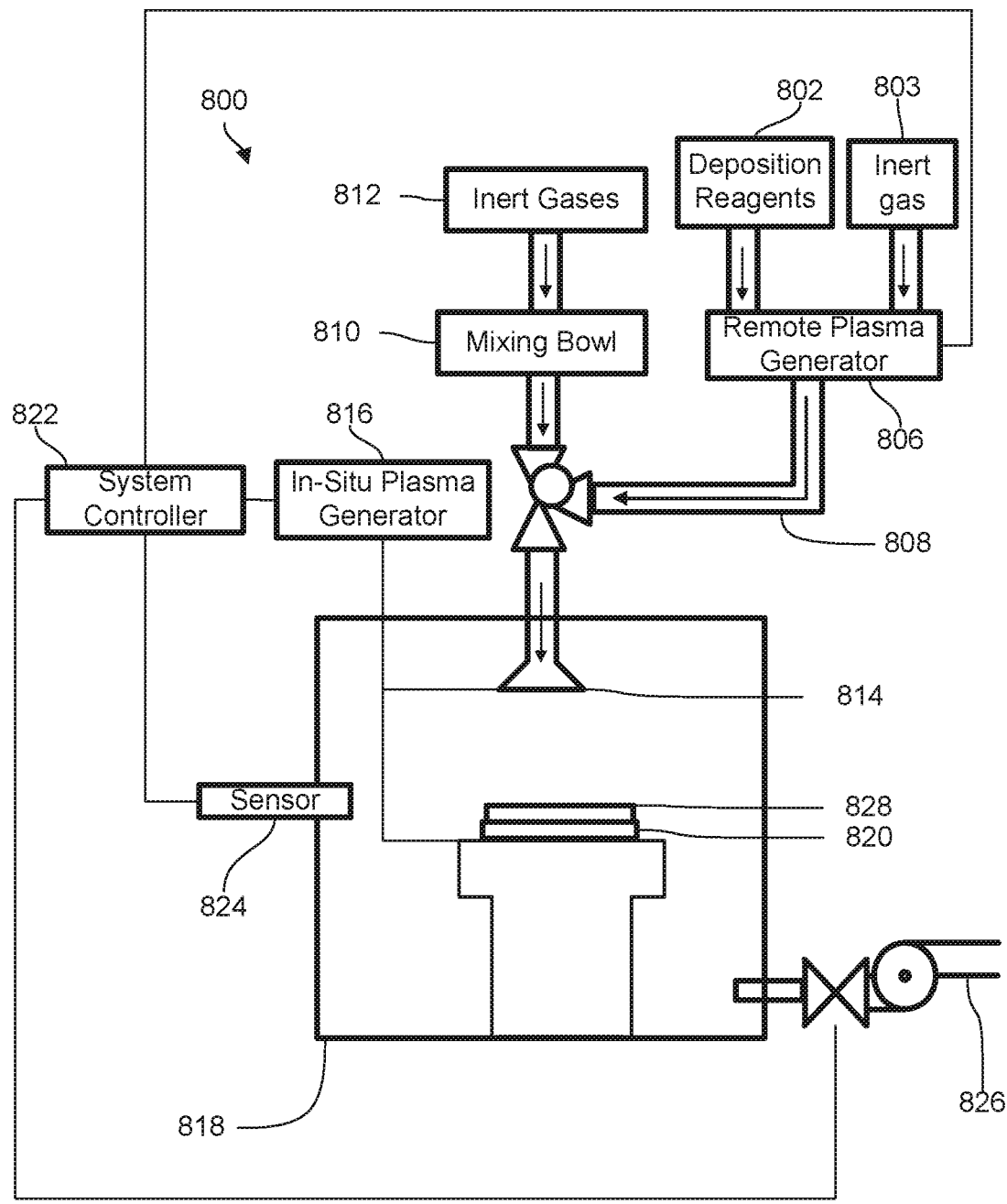
FIG. 8 is a schematic representation of an apparatus including a deposition chamber for performing a metal deposition process in accordance with certain implementations.

The methods presented herein may be carried out in a variety of apparatuses available from various vendors. Examples of apparatuses which may be suitable include the Novellus Concept-1 ALTUS™, Concept-2 ALTUS™, Concept-2 ALTUS-S™, Concept-3 ALTUS™, and ALTUS Max™ deposition systems, or any of a variety of other commercially available chemical vapor deposition (CVD) tools. FIG. 8 illustrates a schematic representation of an apparatus 800 for processing a partially fabricated semiconductor substrate in accordance with certain embodiments. The apparatus 800 includes a chamber 818 with a pedestal 820, a showerhead 814, an in-situ plasma generator 816, and a remote plasma generator 806. The pedestal 820 is configured to support a semiconductor substrate 828. The apparatus 800 also includes a system controller 822 to receive input and/or supply control signals to various devices.

Deposition reagents, including diborane balanced with hydrogen, may be supplied from a source 802, which may be a storage tank. In some implementations, the deposition reagents are supplied to the remote plasma generator 806. Any suitable remote plasma generator may be used for activating the deposition reagents before introducing it into a deposition chamber 818. For example, remote plasma generating units, such as ASTRON® i Type AX7670, ASTRON® e Type AX7680, ASTRON® ex Type AX7685, ASTRON® hf-s Type AX7645, all available from MKS Instruments of Andover, Mass., may be used. In general, a remote plasma generator unit is typically a self-contained device generating a free-radical based plasma (which may also to some extent be weakly ionized) using the supplied deposition reagent. The remote plasma generator is a high power RF generator that provides energy to the electrons in the plasma. This energy is then transferred to the neutral reagent leading to temperature on the order of 20,00K causing thermal dissociation of these molecules. A remote plasma generator unit may dissociate more than 60% of incoming reagent because of its high RF energy and special channel geometry causing the etchant to adsorb most of this energy.

In certain embodiments, such as that illustrated in FIG. 8, one or more reagents are flowed from the remote plasma generator 806 through a connecting line 808 into the deposition chamber 818, where the mixture is distributed through showerhead 814. In other embodiments, one or more reagents are flowed into the deposition chamber 818 directly completely bypassing the remote plasma generator 806 (e.g., the apparatus 800 does not include such generator 806). Alternatively, the remote plasma generator 806 may be turned off while flowing the one or more reagents into the deposition chamber 818, for example, because activation of the one or more reagents is not needed. In addition, in certain embodiments, inert gases, such as argon, helium and others, are also supplied from a source 803, which may also be a storage tank.

Once precursor reagents are introduced into the deposition chamber 818, in situ plasma activation may be accomplished via an internal plasma generator 816 attached to the showerhead 814 and the pedestal 820. In a particular embodiment, the internal plasma generator 816 is a High Frequency (HF) RF generator capable of providing between about 0 W and 10,000 W of power at frequencies between about 1 and 100 MHz. In a more specific embodiment, the HF RF generator may deliver between about 0 and 5,000 W of power at about 13.56 MHz. In some implementations, the internal plasma generator 816 may generate an in-situ plasma to enhance removal of deposited metal.

The chamber 818 may include a sensor 824 for sensing various process parameters, such as degree of deposition and etching, concentrations, pressure, temperature, and others. The sensor 824 may provide information on chamber conditions during the process to the system controller 822. Examples of the sensor 824 include mass flow controllers, pressure sensors, thermocouples, and others. The sensor 824 may also include an infra-red detector or optical detector to monitor presence of gases in the chamber and control measures. The sensor 824 provide information which may be used to determine the flow rates of reducing agents and tungsten-containing precursors to the processing chamber, as well as flow rates of plasma species and their precursors from and to, respectively, the remote plasma generator 806.

Deposition and selective removal operations generate various volatile species that are evacuated from the deposition chamber 818. Moreover, processing is performed at certain predetermined pressure levels the chamber 818. Both of these functions are achieved using a vacuum outlet 826, which may be a vacuum pump.

In certain embodiments, a system controller 822 is employed to control process conditions and parameters during metal deposition and etch operations. The system controller 822 typically includes one or more memory devices and one or more processors. The processor may include a CPU or computer, analog and/or digital input/output connections, stepper motor controller boards, etc. Typically there will be a user interface associated with system controller 822. The user interface may include a display screen, graphical software displays of the apparatus and/or process conditions, and user input devices such as pointing devices, keyboards, touch screens, microphones, etc.

In certain embodiments, the system controller 822 controls the substrate temperature, chamber pressure, reagent flow rates, power output and operating frequency (or frequency range) of the remote plasma generator 806, power output and operating frequency (or frequency range) of the in situ plasma generator 816, and other process parameters. The system controller 822 executes system control software and instructions to provide the aforementioned control. Other computer programs stored on memory devices associated with the controller may be employed in some embodiments.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include substrate temperature control code, chamber pressure control code, reagent flow rate control code, process gas control code, remote plasma generator control code (possibly including power output and operating frequency control code), in situ plasma generator control code (possibly including power output and operating frequency control code), and control code for other process parameters.

Parameters for controlling substrate temperature, chamber pressure, reagent flow rates, power output and operating frequency (or frequency range) of the remote plasma generator, power output and operating frequency (or frequency range) of the in situ plasma generator, and other process parameters may be provided by the user in the form of a recipe, and may be entered utilizing the user interface.

Signals for monitoring the process may be provided by analog and/or digital input connections of the system controller 822. The signals for controlling processes are output on the analog and digital output connections of the apparatus 800.

In some implementations, the system controller 822 is configured with instructions for performing the following operations: introduce a gas mixture from a gas supply line into a deposition chamber to a surface of a semiconductor substrate, where the gas mixture includes diborane with a balance of hydrogen, where the semiconductor substrate includes a vertical structure having a plurality of horizontally-oriented features, where the diborane decomposes to form a boron layer in the horizontally-oriented features; and convert the boron layer to a transition metal layer in the semiconductor substrate. In some implementations, converting the boron layer includes exposing the boron layer to a transition metal precursor.

Figure 9:
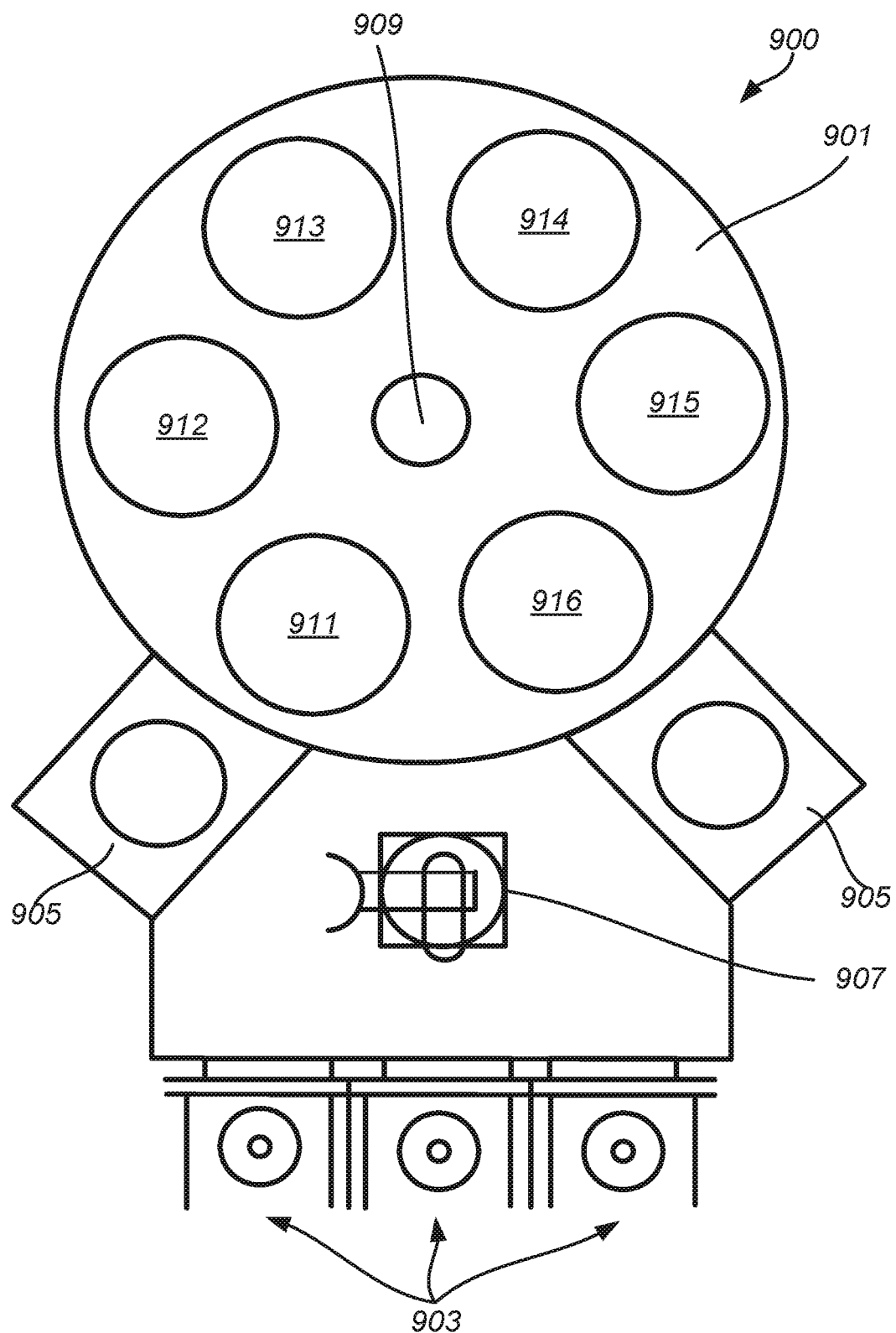
FIG. 9 is a schematic representation of a multi-station apparatus for performing metal deposition and/or etch operations in accordance with certain implementations.

FIG. 9 shows an example of a multi-station apparatus 900. The apparatus 900 includes a process chamber 901 and one or more cassettes 903 (e.g., Front Opening Unified Pods) for holding substrates to be processed and substrates that have completed processing. The chamber 901 may have a number of stations, for example, two stations, three stations, four stations, five stations, six stations, seven stations, eight stations, ten stations, or any other number of stations. The number of stations in usually determined by a complexity of the processing operations and a number of these operations that can be performed in a shared environment. FIG. 9 illustrates the process chamber 901 that includes six stations, labeled 911 through 916. All stations in the multi-station apparatus 900 with a single process chamber 901 are exposed to the same pressure environment. However, each station may have a designated reactant distribution system and local plasma and heating conditions achieved by a dedicated plasma generator and pedestal, such as the ones illustrated in FIG. 8.

A substrate to be processed is loaded from one of the cassettes 903 through a load-lock 905 into the station 911. An external robot 907 may be used to transfer the substrate from the cassette 903 and into the load-lock 905. In the depicted embodiment, there are two separate load locks 905. These are typically equipped with substrate transferring devices to move substrates from the load-lock 905 (once the pressure is equilibrated to a level corresponding to the internal environment of the process chamber 901) into the station 911 and from the station 916 back into the load-lock 905 for removal from the processing chamber 901. A mechanism 909 is used to transfer substrates among the processing stations 911-916 and support some of the substrates during the process as described below.

In certain embodiments, one or more stations may be reserved for heating the substrate. Such stations may have a heating lamp (not shown) positioned above the substrate and/or a heating pedestal supporting the substrate similar to one illustrated in FIG. 8. For example, a station 911 may receive a substrate from a load-lock and be used to pre-heat the substrate before being further processed. Other stations may be used for filling high aspect ratio features including deposition and etching operations.

After the substrate is heated or otherwise processed at the station 911, the substrate is moved successively to the processing stations 912, 913, 914, 915, and 916, which may or may not be arranged sequentially. The multi-station apparatus 900 is configured such that all stations are exposed to the same pressure environment. In so doing, the substrates are transferred from the station 911 to other stations in the chamber 901 without a need for transfer ports, such as load-locks.

In certain embodiments, one or more stations may be used to fill features with tungsten-containing materials. For example, stations 912 may be used for an initial deposition operation, station 913 may be used for a corresponding selective removal operation. In the embodiments where a deposition-removal cycle is repeated, stations 914 may be used for another deposition operations and station 915 may be used for another partial removal operation. Section 916 may be used for the final filling operation. It should be understood that any configurations of station designations to specific processes (heating, filling, and removal) may be used.

As an alternative to the multi-station apparatus described above, the method may be implemented in a single substrate chamber or a multi-station chamber processing a substrate(s) in a single processing station in batch mode (i.e., non-sequential). In this aspect of the invention, the substrate is loaded into the chamber and positioned on the pedestal of the single processing station (whether it is an apparatus having only one processing station or an apparatus having multi-stations running in batch mode). The substrate may be then heated and the deposition operation may be conducted. The process conditions in the chamber may be then adjusted and the selective removal of the deposited layer is then performed. The process may continue with one or more deposition-removal cycles and with the final filling operation all performed on the same station. Alternatively, a single station apparatus may be first used to perform only one of the operation in the new method (e.g., depositing, selective removal, final filling) on multiple wafers after which the substrates may be returned back to the same station or moved to a different station (e.g., of a different apparatus) to perform one or more of the remaining operations.

Figure 10:
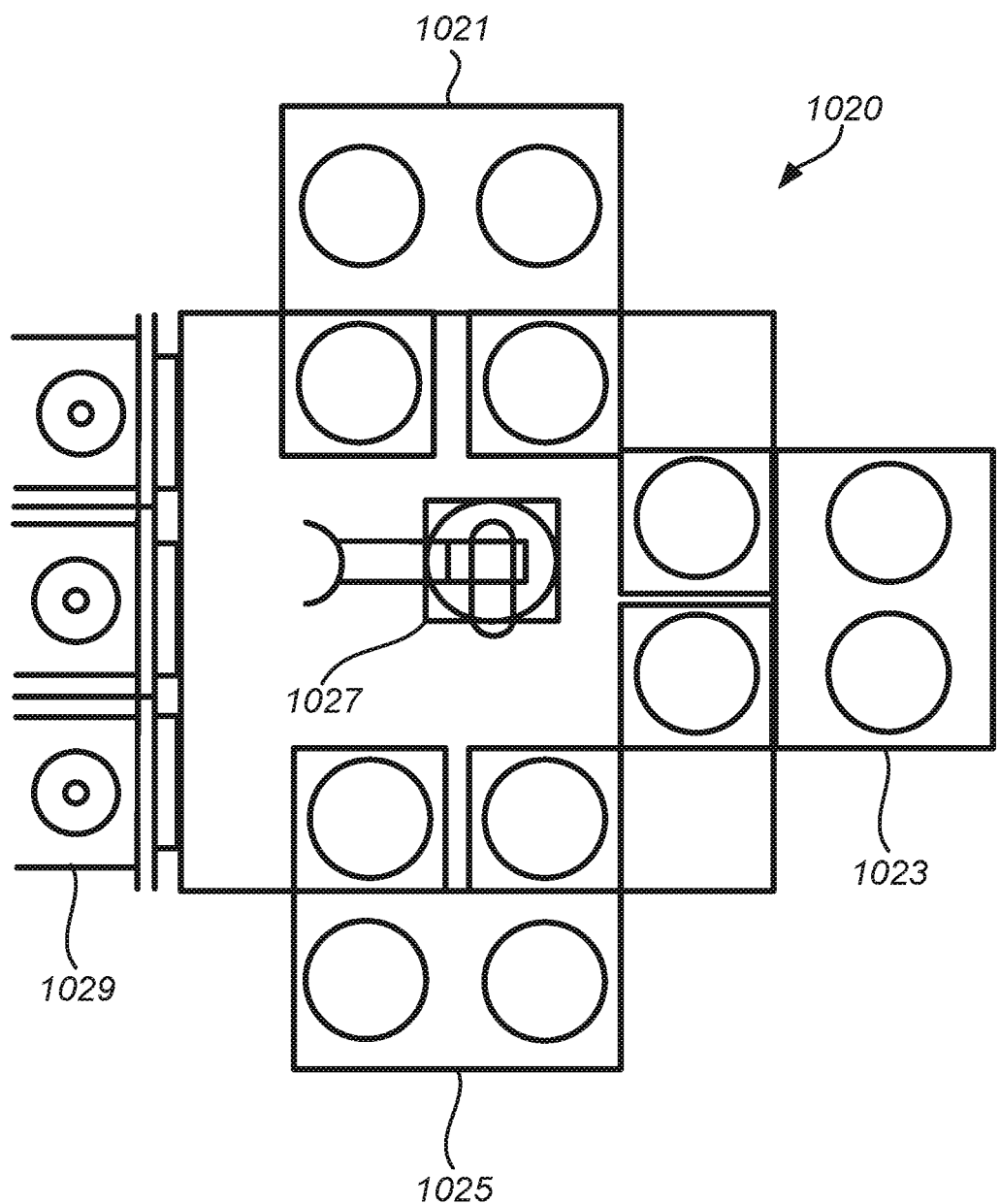
FIG. 10 is a schematic representation of a multi-station apparatus for performing metal deposition and/or etch operations in accordance with certain implementations.

FIG. 10 is a schematic illustration of a multi-chamber apparatus 1020 that may be used in accordance with certain embodiments. As shown, the apparatus 1020 has three separate chambers 1021, 1023, and 1025. Each of these chambers is illustrated with two pedestals. It should be understood that an apparatus may have any number of chambers (e.g., one, two, three, four, five, six, etc.) and each chamber may have any number of chambers (e.g., one, two, three, four, five, six, etc.). Each chamber 1021-1025 has its own pressure environment, which is not shared between chambers. Each chamber may have one or more corresponding transfer ports (e.g., load-locks). The apparatus may also have a shared substrate handling robot 1027 for transferring substrates between the transfer ports one or more cassettes 1029.

As noted above, separate chambers may be used for depositing tungsten containing materials and selective removal of these deposited materials in later operations. Separating these two operations into different chambers can help to substantially improve processing speeds by maintaining the same environmental conditions in each chamber. In other words, a chamber does not need to change its environment from conditions used for deposition to conditions used for selective removal and back, which may involve different precursors, different temperatures, pressures, and other process parameters. In certain embodiments, it is faster to transfer partially manufactured semiconductor substrates between two or more different chambers than changing environmental conditions of these chambers.

In some embodiments, a system controller (which may include one or more physical or logical controllers) controls some or all of the operations of an etching chamber, a deposition chamber, and/or a multi-module tool including one or more etching modules and/or one or more deposition modules. The system controller may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any one or more of the following chamber operational conditions: the mixture and/or composition of gases, chamber pressure, chamber temperature, wafer temperature, the bias applied to the wafer, the frequency and power applied to coils or other plasma generation components, wafer position, wafer movement speed, and other parameters of a particular process performed by the tool. System control software may be configured in any suitable way. For example, various process tool component subroutines or control objects may be written to control operation of the process tool components necessary to carry out various process tool processes. System control software may be coded in any suitable computer readable programming language.

In some embodiments, system control software includes input/output control (IOC) sequencing instructions for controlling the various parameters described above. For example, each phase of a semiconductor fabrication process may include one or more instructions for execution by the system controller. The instructions for setting process conditions for an etching phase may be included in a corresponding etching recipe phase, for example. In some embodiments, the recipe phases may be sequentially arranged, so that all instructions for a process phase are executed concurrently with that process phase. The instructions for setting process conditions for an deposition phase may be included in a corresponding deposition recipe phase.

Other computer software and/or programs may be employed in some embodiments. Examples of programs or sections of programs for this purpose include a substrate positioning program, a process gas composition control program, a pressure control program, a heater control program, and an RF power supply control program.

In some cases, the controllers control gas concentration, wafer movement, and/or the power supplied to the coils and/or electrostatic chuck. In some cases, the controllers control gas concentration, wafer movement, and/or the power supplied to a remote plasma generator.

The controller may control the gas concentration by, for example, opening and closing relevant valves to produce one or more inlet gas streams that provide the necessary reactant(s) at the proper concentration(s). The wafer movement may be controlled by, for example, directing a wafer positioning system to move as desired. The power supplied to the coils and/or chuck and/or remote plasma generator may be controlled to provide particular RF power levels. The controllers may control these or other aspects based on sensor output (e.g., when power, potential, pressure, etc. reach a certain threshold), the timing of an operation (e.g., opening valves at certain times in a process) or based on received instructions from a user.

Photolithography

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or X-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Other Embodiments

Although the foregoing disclosed processes, methods, systems, apparatuses, and compositions have been described in detail within the context of specific embodiments for the purpose of promoting clarity and understanding, it will be apparent to one of ordinary skill in the art that there are many alternative ways of implementing these processes, methods, systems, apparatuses, and compositions which are within the spirit of this disclosure. Accordingly, the embodiments described herein are to be viewed as illustrative of the disclosed inventive concepts rather than restrictively, and are not to be used as an impermissible basis for unduly limiting the scope of any claims eventually directed to the subject matter of this disclosure.

What is claimed is:

1. A method comprising:
providing a gas mixture in a gas supply line, wherein the gas mixture is stored in a gas supply source fluidly coupled to the gas supply line and includes diborane ($B_2H_6$) with a balance of hydrogen ($H_2$);
introducing the gas mixture from the gas supply line into a deposition chamber to a surface of a semiconductor substrate, wherein the semiconductor substrate includes a vertical structure having a plurality of horizontally-oriented features, wherein the diborane decomposes to form a boron layer in the horizontally-oriented features; and
converting the boron layer to a transition metal layer in the semiconductor substrate.

2. The method of claim 1, wherein the gas mixture includes at least 20% by volume of diborane with the balance of hydrogen.

3. The method of claim 2, wherein the gas mixture includes between about 20% and about 50% by volume of diborane with the balance of hydrogen.

4. The method of claim 1, wherein the transition metal layer includes molybdenum, ruthenium, cobalt, or tungsten.

5. The method of claim 1, wherein converting the boron layer to the transition metal layer comprises reacting the boron layer with a tungsten-containing precursor to form a tungsten layer.

6. The method of claim 5, wherein the tungsten-containing precursor includes tungsten hexafluoride ($WF_6$), tungsten hexachloride ($WCl_6$), or tungsten hexacarbonyl ($W(CO)_6$).

7. The method of claim 1, wherein the gas mixture is substantially free of nitrogen ($N_2$).

8. The method of claim 1, wherein the semiconductor substrate has openings in sidewalls of the vertical structure that are fluidically accessible from the vertical structure through the openings.

9. The method of claim 1, wherein the vertical structure is a three-dimensional (3-D) vertical NAND structure.

10. The method of claim 1, wherein the boron layer is conformally deposited in the horizontally-oriented features of the vertical structure, the boron layer having a step coverage of at least 90%.

11. The method of claim 1, wherein introducing the gas mixture comprises pulsing the diborane with the balance of hydrogen for a period of time between about 0.1 seconds and about 10 seconds in a pulsed nucleation layer (PNL) deposition cycle.

12. The method of claim 1, wherein introducing the gas mixture comprises pulsing the diborane with the balance of hydrogen for a period of time between about 1 second and about 60 seconds.

13. The method of claim 1, further comprising:
exposing the semiconductor substrate to a reducing gas, wherein the reducing gas includes silane, disilane, or hydrogen.

14. An apparatus comprising:
a gas supply source, wherein the gas supply source stores a gas mixture of diborane with a balance of hydrogen;
a gas supply line fluidly coupled with the gas supply source;
a deposition chamber coupled to the gas supply line, wherein the deposition chamber is configured to process a semiconductor substrate in the deposition chamber, the semiconductor substrate including a vertical structure having a plurality of horizontally-oriented features; and
a controller configured with instructions for performing the following operations:
introducing the gas mixture from the gas supply line into the deposition chamber to a surface of the semiconductor substrate, where the diborane decomposes to form a boron layer in the horizontally-oriented features; and
converting the boron layer to a transition metal layer in the semiconductor substrate.

15. The apparatus of claim 14, wherein the gas mixture includes at least 200% by volume of diborane with the balance of hydrogen.

16. The apparatus of claim 15, wherein the gas mixture includes between about 20% and about 50% by volume of diborane with the balance of hydrogen.

17. The apparatus of claim 14, wherein the transition metal layer includes molybdenum, ruthenium, cobalt, or tungsten.

18. The apparatus of claim 14, wherein the controller configured with instructions for converting the boron layer is configured with instructions for reacting the boron layer with a transition metal precursor to form the transition metal layer.

19. The apparatus of claim 14, wherein the semiconductor substrate has openings in sidewalls of the vertical structure that are fluidically accessible from the vertical structure through the openings.

20. The apparatus of claim 14, wherein the controller is further configured with instructions for performing the following operation:
exposing the semiconductor substrate to a reducing gas, wherein the reducing gas includes silane, disilane, or hydrogen.

* * * * *